(12) United States Patent
Lee

(10) Patent No.: US 11,910,685 B2
(45) Date of Patent: Feb. 20, 2024

(54) DISPLAY DEVICE HAVING THROUGH HOLE AT LIGHT BLOCKING REGION AND METHOD OF PROVIDING THE SAME

(71) Applicant: Samsung Display Co., LTD., Yongin-si (KR)

(72) Inventor: Seon Uk Lee, Seongnam-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 392 days.

(21) Appl. No.: 17/159,959

(22) Filed: Jan. 27, 2021

(65) Prior Publication Data

US 2021/0359011 A1    Nov. 18, 2021

(30) Foreign Application Priority Data

May 14, 2020 (KR) .......................... 10-2020-0057887

(51) Int. Cl.

| | |
|---|---|
| H10K 59/38 | (2023.01) |
| H10K 50/84 | (2023.01) |
| H10K 50/13 | (2023.01) |
| H10K 50/813 | (2023.01) |
| H10K 50/822 | (2023.01) |
| H10K 50/858 | (2023.01) |
| H10K 59/122 | (2023.01) |

(52) U.S. Cl.
CPC ........... *H10K 59/38* (2023.02); *H10K 50/131* (2023.02); *H10K 50/813* (2023.02); *H10K 50/822* (2023.02); *H10K 50/84* (2023.02); *H10K 50/858* (2023.02); *H10K 59/122* (2023.02)

(58) Field of Classification Search
CPC .... H10K 50/131; H10K 59/122; H10K 50/84; H10K 50/858; H10K 50/822; H10K 50/813

USPC .......................................................... 257/40
See application file for complete search history.

(56) References Cited

U.S. PATENT DOCUMENTS

| 2018/0088404 A1* | 3/2018 | Chae ...................... H10K 59/38 |
| 2019/0025634 A1* | 1/2019 | Park .................. G02F 1/133516 |

FOREIGN PATENT DOCUMENTS

| EP | 3637471 A1 | 4/2020 |
| KR | 1020070049172 A | 5/2007 |
| KR | 10-0993101 B1 | 11/2010 |

(Continued)

OTHER PUBLICATIONS

European Search Report for European Patent Application No. 21173951.1 dated Oct. 26, 2021.

*Primary Examiner* — Xia L Cross

(74) *Attorney, Agent, or Firm* — CANTOR COLBURN LLP

(57) ABSTRACT

A display device includes a substrate including a light transmission region and a light blocking region, a first color filter pattern which is on the substrate and selectively transmits light of a first color, a bank layer facing the substrate with the first color filter pattern therebetween, in the light transmission region each of a first opening defined in the bank layer and a wavelength control pattern in the first opening of the bank layer, and in the light blocking region each of a second opening defined in the bank layer and spaced apart from the first opening; and a spacer in the second opening of the bank layer. Each of the first opening and the second opening corresponds to the first color filter pattern.

20 Claims, 16 Drawing Sheets

(56) References Cited

FOREIGN PATENT DOCUMENTS

| KR | 1020160017373 A | 2/2016 |
|----|-----------------|--------|
| KR | 1020190057190 A | 5/2019 |

* cited by examiner

TA: TA1, TA2, TA3
PXS: PXS_1, PXS_2, PXS_3

DISPLAY DEVICE HAVING THROUGH HOLE AT LIGHT BLOCKING REGION AND METHOD OF PROVIDING THE SAME

This application claims priority to Korean Patent Application No. 10-2020-0057887, filed on May 14, 2020, and all the benefits accruing therefrom under 35 U.S.C. § 119, the disclosure of which is incorporated herein by reference in its entirety.

BACKGROUND

1. Field

The disclosure relates to a display device and a method of providing the same.

2. Description of the Related Art

The importance of display devices has steadily increased with the development of multimedia technology. Accordingly, various types of display devices such as a liquid crystal display ("LCD"), an organic light emitting display ("OLED") and the like have been used.

The display devices include a self-light emitting display device which includes a self-light emitting element such as an organic light emitting diode and excludes a separate power source. The self-light emitting element may include two opposing electrodes and a light emitting layer formed therebetween. In the organic light emitting diode as the self-light emitting element, the electrons and holes from the two electrodes are recombined in the light emitting layer to produce excitons, which transition from the excited state to the ground state, thereby emitting light.

Such a self-light emitting display device is attracting attention as a next-generation display as meeting the high display quality requirements such as wide viewing angle, high brightness and contrast, and quick response speed, as well as having a low power consumption, a light weight and a small thickness due to omitting the separate power source.

SUMMARY

Embodiments of the invention provide a display device having improved display quality and a method of providing the display device which has the improved display quality.

However, embodiments are not restricted to the ones set forth herein. The above and other features of the invention will become more apparent to one of ordinary skill in the art to which the invention pertains by referencing the detailed description of the disclosure given below.

An embodiment of a display device includes a substrate including a light transmission region and a light blocking region, a first color filter pattern which is on the substrate and selectively transmits light of a first color, a bank layer facing the substrate with the first color filter pattern therebetween, in the light transmission region, each of a first opening defined in the bank layer and a wavelength control pattern in the first opening of the bank layer, and in the light blocking region, each of a second opening defined in the bank layer and spaced apart from the first opening and a spacer in the second opening of the bank layer. Each of the first opening and the second opening corresponds to the first color filter pattern.

An embodiment of a display device includes a first display substrate and a second display substrate facing the first display substrate. The first display substrate includes a first substrate, a first electrode on the first substrate, a pixel defining layer on the first electrode, an opening in the pixel defining layer which exposes the first electrode to outside the pixel defining layer, a light emitting layer in the opening of the pixel defining layer, and a second electrode facing the first electrode with the light emitting layer therebetween. The second display substrate includes in order in a direction toward the first display substrate, a second substrate, a color filter layer, a bank layer defining both an opening and a through hole spaced apart from the opening, a wavelength conversion pattern in the opening of the bank layer, and a spacer in the through hole.

An embodiment of a method of providing a display device includes providing a substrate including a light transmission region at which light is emitted from the display device, and a light blocking region which is adjacent to the light transmission region, providing a color filter layer on the substrate, providing a bank layer facing the substrate with the color filter layer therebetween, providing in the light transmission region both a first opening defined in the bank layer; and a color control layer in the first opening, through an inkjet printing process, the color control layer having a thickness, and providing in the light blocking region, a second opening defined in the bank layer and spaced apart from the first opening, the second opening having a depth. The providing of the color control layer in the first opening includes providing the thickness based on the depth of the second opening, and each of the first opening and the second opening corresponds to the color filter layer.

In one or more embodiment of a display device and a method of providing the display device, the display quality of the display device can be improved.

The effects of the disclosure are not limited to the aforementioned effects, and various other effects are included in the disclosure.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
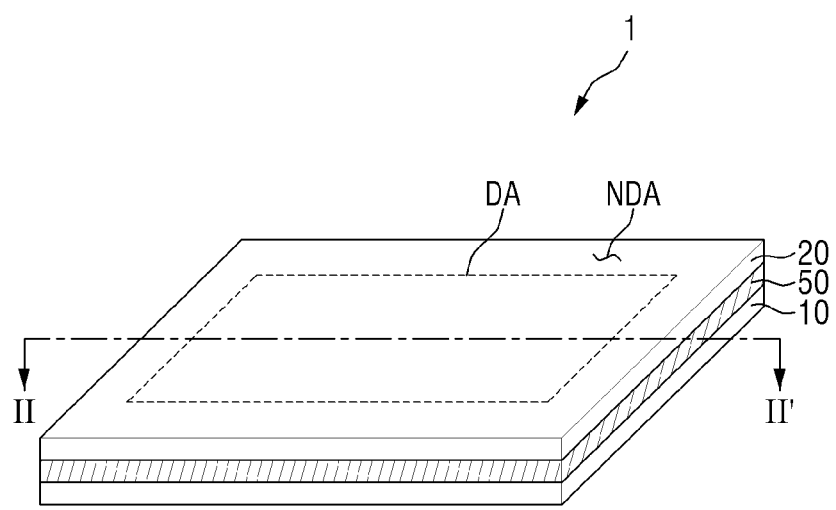
FIG. 1 is a perspective view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no other layer or substrate, or intervening layers are present.

Although the terms "first," "second," etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments will be described in detail with reference to the accompanying drawings.

FIG. 1 is a perspective view of an embodiment of a display device 1.

Referring to FIG. 1, a display device 1 may refer to any electronic device providing a display screen at which an image is displayed. Examples of the display device 1 may include a television, a laptop computer, a monitor, a billboard, a mobile phone, a smartphone, a tablet personal computer ("PC"), an electronic watch, a smart watch, a watch phone, a mobile communication terminal, an electronic notebook, an electronic book, a portable multimedia player ("PMP"), a navigation device, a game machine, a digital camera, an Internet-of-Things device and the like, which provide a display screen.

The display device 1 illustrated in the drawing is a television ("TV"). The display device 1 may have a high resolution or an ultra-high resolution such as high-definition ("HD"), ultra-high-definition ("UHD"), 4K, and 8K, without being limited thereto.

The display device 1 may have a rectangular shape in a plan view. The planar shape of the display device 1 is not limited to the exemplified one, but may have a circular shape or other planar shapes.

The display device 1 may include a display area DA at which an image is displayed and a non-display area NDA at which an image is not displayed. The display area DA may include a pixel PX provided in plural including a plurality of pixels PX at which light is generated, an image is displayed, etc. The non-display area NDA is adjacent to the display area DA. In an embodiment, the non-display area NDA may be located around the display area DA and may surround the display area DA, in the plan view.

Figure 2:
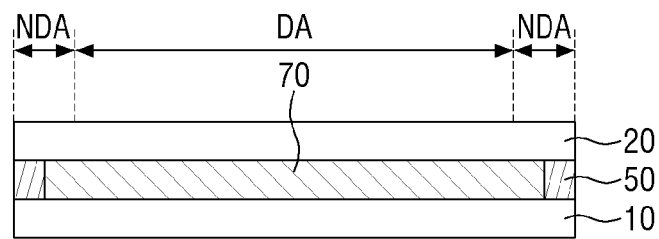
FIG. 2 is a schematic cross-sectional view taken along line II-IP of FIG. 1.

FIG. 2 is a cross-sectional view taken along line II-IP of FIG. 1.

Referring to FIG. 2, the display device 1 may include a first display substrate 10 and a second display substrate 20 facing the first display substrate 10. The display device 1 may further include a sealing member 50 that couples the first display substrate 10 to the second display substrate 20, and a filling layer 70 which fills a space between the first display substrate 10 and the second display substrate 20.

The first display substrate 10 may include elements and circuits for generating and/or displaying an image. The first display substrate 10 may include, for example, a pixel circuit such as a switching element, a self-light emitting element, and a pixel defining layer PDL that defines an emission region and a non-emission region NEM, which will be described later, in the display area DA. In an embodiment, the self-light emitting element may include at least one of an organic light emitting diode, a quantum dot light emitting diode, an inorganic micro light emitting diode (e.g., "micro LED"), or an inorganic nano light emitting diode (e.g., "nano LED"). Hereinafter, the self-light emitting element is described as an organic light emitting diode by way of example.

The second display substrate 20 may be located above the first display substrate 10 to face the first display substrate 10. The second display substrate 20 may include a color control structure that converts the color of light incident thereto (e.g., incident light). The color control structure may control the wavelength of incident light, thereby converting the color of incident light.

The sealing member 50 may be positioned between the first display substrate 10 and the second display substrate 20, in the non-display area NDA. The sealing member 50 may be disposed along edges of the first display substrate 10 and the second display substrate 20 in the non-display area NDA, and may surround the display area DA in a plan view. The first display substrate 10 and the second display substrate 20 may be coupled to each other via the sealing member 50. The sealing member 50 may include an organic material. The sealing member 50 may include or be made of an epoxy resin, but is not limited thereto.

A filling layer 70 may be disposed in a space defined between the first display substrate 10 and the second display substrate 20 together with the sealing member 50. The filling layer 70 may fill the space between the first display substrate 10 and the second display substrate 20. The filling layer 70 may include or be made of a material that can transmit light. The filling layer 70 may include an organic material. In an embodiment, for example, the filling layer 70 may include or be formed of a Si-based organic material, an epoxy-based organic material or the like, but is not limited thereto. In an embodiment, the filling layer 70 may be omitted.

Figure 3:
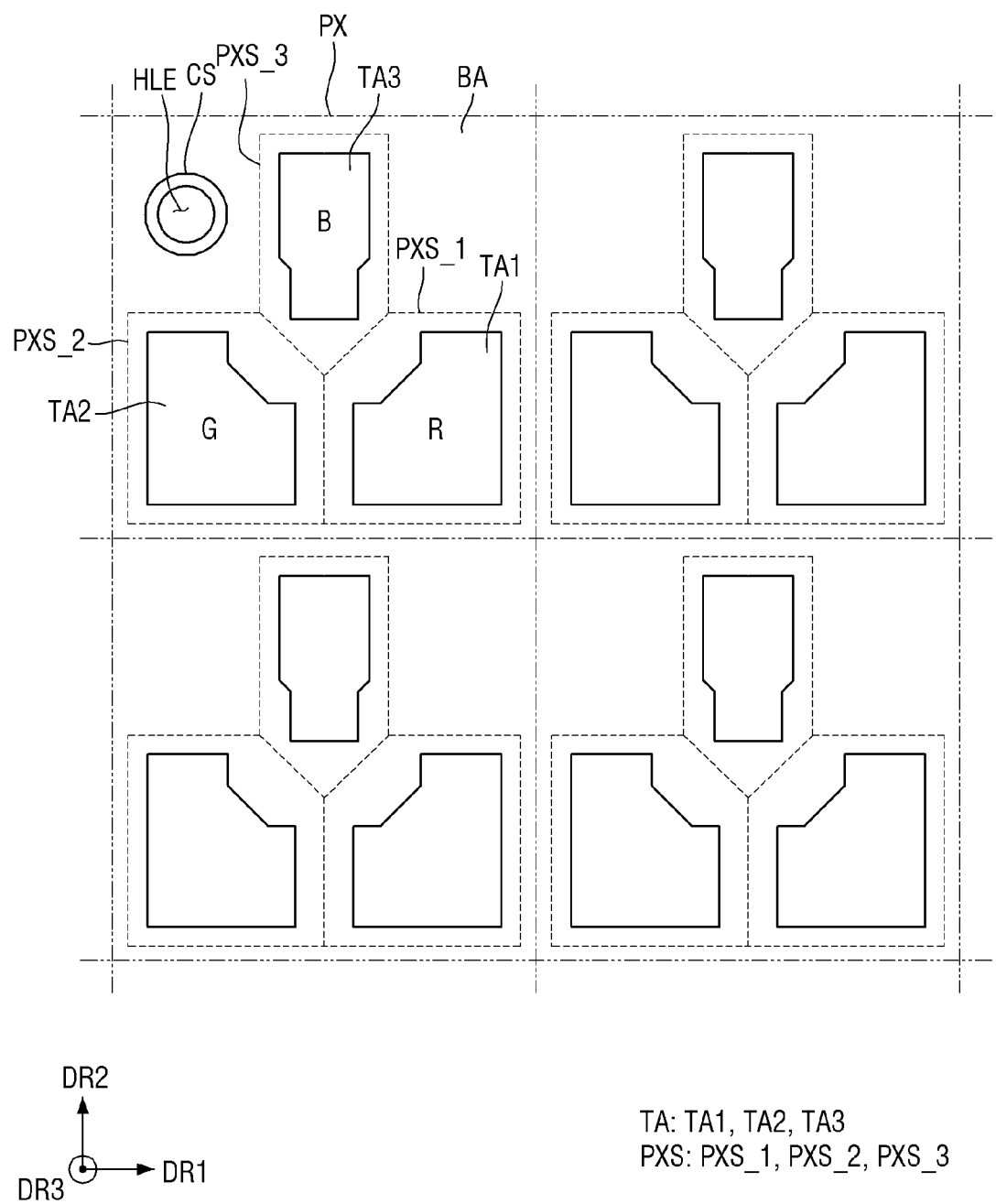
FIG. 3 is a schematic plan view showing an embodiment of a pixel arrangement of a display device.

FIG. 3 is a schematic plan view showing an embodiment of a pixel arrangement of a display device 1. In FIG. 3, a first direction DR1 indicates a horizontal direction in the plan view, a second direction DR2 indicates a vertical direction in the plan view which intersects the first direction DR1, and a third direction DR3 indicates a thickness direction of the display device 1 (see FIG. 1) which intersects both the first direction DR1 and the second direction DR2.

Referring to FIG. 3, the display area DA of the display device 1 includes a plurality of pixels PX. The pixel PX represents a minimum unit which generates light and/or displays an image, and which is repeated along the display area DA for displaying an image. In order to display full color, each of the pixels PX may include a plurality of sub-pixels PXS generating and/or emitting light of different colors. In an embodiment, for example, each of the pixels PX may include a first sub-pixel PXS_1 responsible for red light emission, a second sub-pixel PXS_2 responsible for green light emission, and a third sub-pixel PXS_3 responsible for blue light emission. One or each of the first sub-pixel PXS_1, the second sub-pixel PXS_2 and the third sub-pixel PXS_3 may be provided for each of the pixels PX.

Each of the sub-pixels PXS may include a light transmission region TA provided in plural including light transmission regions TA, and a light blocking region BA which is adjacent to and surrounds the light transmission regions TA. The light blocking region BA of one of the sub-pixels PXS is in contact with the light blocking region BA of a neighboring one of the sub-pixels PXS (regardless of whether the sub-pixels PXS are in a same one of the pixels PX). The light blocking regions BA of the sub-pixels PXS which are adjacent to each other may be integrally connected. Further, the light blocking regions BA of all the sub-pixels PXS may be integrally connected, but the disclosure is not limited thereto. The light transmission regions TA of the sub-pixels PXS which are adjacent to each other may be distinguished from each other by portions of the light blocking region BA. The light transmission regions TA and the light blocking region BA will be described in detail later.

Conceptually, the sub-pixels PXS which are adjacent to teach other may be interpreted as being in contact with each other. Elements which are in contact with each other may form an interface or a boundary therebetween. The boundary between the sub-pixels PXS may be placed in the light blocking region BA as an integral layer, so that the sub-pixels PXS may not be physically distinguished. The boundary between the sub-pixels PXS may be placed in an intermediate point (or an intermediate point of the light blocking region BA along the width direction) of the spaces respectively between the light transmission regions TA of the sub-pixels PXS which are adjacent to each other. The overall shape of the sub-pixel PXS may be in a similar relationship to the shape of the light transmission regions TA in the corresponding sub-pixels PXS, but the disclosure is not limited thereto.

The planar shapes of the light transmission regions TA of the sub-pixels PXS in each of the pixels PX may not be the same as each other. In an embodiment, for example, the planar shape of the first light transmission region TA1 of the first sub-pixel PXS_1 may be substantially the same as the shape of the second light transmission region TA2 of the second sub-pixel PXS_2, but may be different from the shape of the third light transmission region TA3 of the third sub-pixel PXS_3, without being limited thereto. In addition, the planar shape of the first light transmission region TA1 of the first sub-pixel PXS_1 and the shape of the second light transmission region TA2 of the second sub-pixel PXS_2 may be symmetrical to each other with respect to a boundary between the first sub-pixel PXS_1 and the second sub-pixel PXS_2.

In the display area DA, a through hole HLE and a spacer CS which is located in the through hole HLE, may be disposed in a portion of the plurality of pixels PX. The through hole HLE and the spacer CS may be disposed in the light blocking region BA of one of the pixels PX. Others of the pixel PX may exclude the through hole HLE and the spacer CS. The spacer CS may serve to maintain a cell gap between the first display substrate 10 and the second display substrate 20. A detailed description of the through hole HLE and the spacer CS will be given later.

The pixels PX including the plurality of sub-pixels PXS may be alternately arranged in a matrix form, in the plan view. The shape and arrangement of the sub-pixels PXS may be the same for each of the pixels PX, but are not limited thereto. The overall planar shape of each of the pixels PX including the plurality of sub-pixels PXS may be a substantially square shape. However, the disclosure is not limited thereto, and the planar shape of each of the pixels PX may be variously modified, such as a rhombus or a rectangle.

Figure 4:
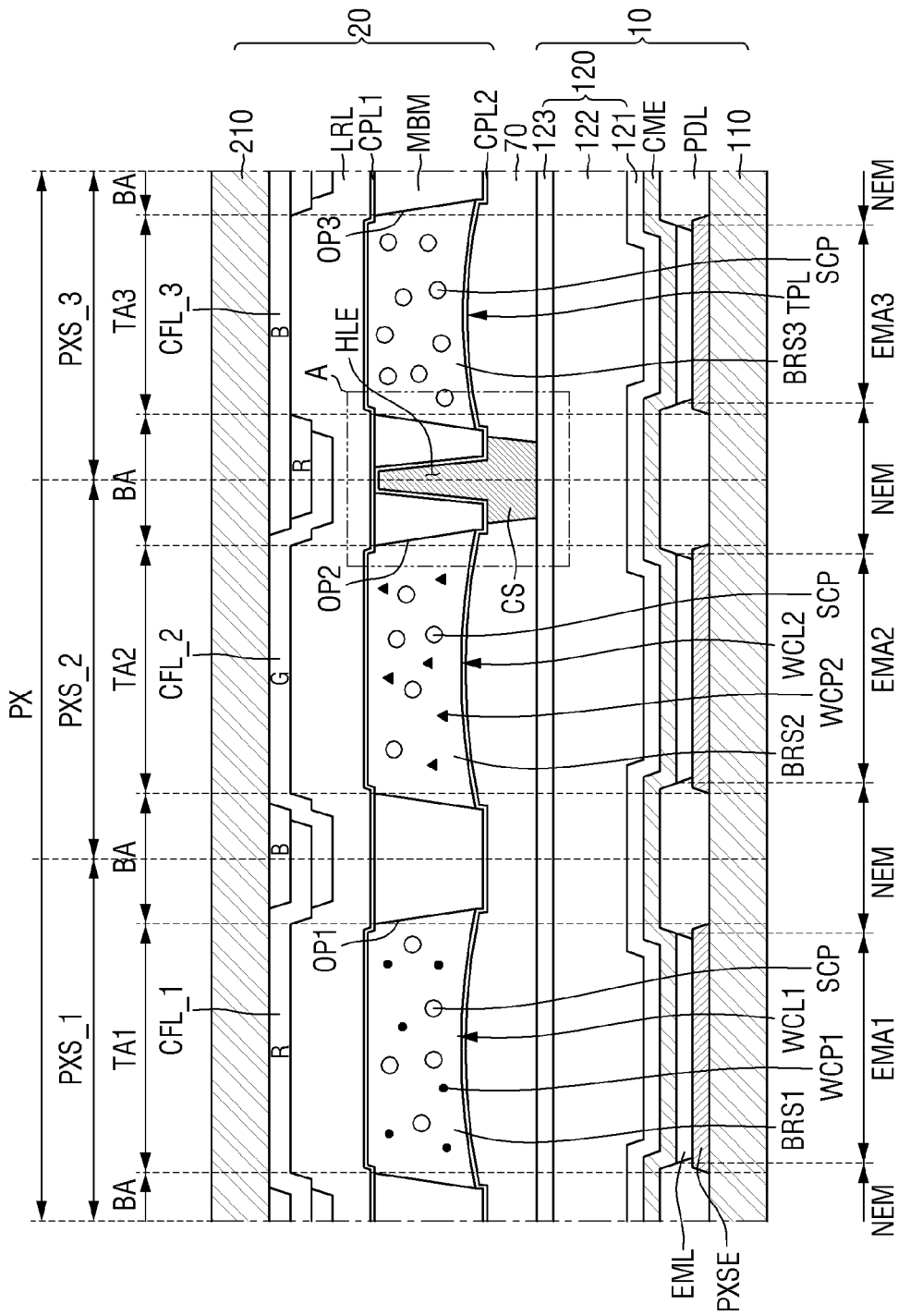
FIG. 4 is a cross-sectional view of an embodiment of a display device.

FIG. 4 is a cross-sectional view of an embodiment of a display device 1.

Referring to FIG. 4, the first display substrate 10 includes a first substrate 110 and a plurality of light emitting elements disposed on the first substrate 110.

When sequentially describing the cross-sectional structure of the first display substrate 10 in an upward direction in FIG. 4, the first substrate 110 may be an insulating substrate. The first substrate 110 may include a transparent material. In an embodiment, for example, the first substrate 110 may include a transparent insulating material such as glass, quartz or the like. The first substrate 110 may be a rigid substrate. However, the first substrate 110 is not limited to the exemplified one. The first substrate 110 may include plastic such as polyimide or the like, and may have a flexible property so as to be bendable, foldable or rollable.

A sub-pixel electrode PXSE may be provided in plural including a plurality of sub-pixel electrodes PXSE disposed on one surface of the first substrate 110. The sub-pixel electrode PXSE may be disposed for each of the sub-pixels PXS. The sub-pixel electrodes PXSE of the sub-pixels PXS which are adjacent to each other may be separated from each other. That is, the sub-pixel electrodes PXSE may be spaced apart from each other in a direction along the first substrate 110. A circuit layer (not shown) which drives each of the sub-pixel electrodes PXSE may be disposed between the first substrate 110 and the sub-pixel electrodes PXSE. The circuit layer (not shown) may include a plurality of thin film transistors, capacitors, and the like.

The sub-pixel electrode PXSE may be a first electrode, e.g., an anode electrode of the light emitting element (or a light emitting diode). The sub-pixel electrode PXSE may have a stacked structure provided or formed by stacking a material layer having a high work function, such as indium tin oxide ("ITO"), indium zinc oxide ("IZO"), zinc oxide ("ZnO") and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a combination thereof. The material layer having a high work function may be disposed above the reflective material layer and disposed closer to a light emitting layer EML, e.g., further from the first substrate 110 than reflective material layer. The sub-pixel electrode PXSE may have a multilayer structure such as ITO/Mg, ITO/MgF, ITO/Ag and ITO/Ag/ITO, but is not limited thereto.

The pixel defining layer PDL may be disposed on one surface of the first substrate 110, along the boundaries of the sub-pixels PXS. The pixel defining layer PDL may be disposed on the sub-pixel electrodes PXSE and may include or define open areas which expose the sub-pixel electrodes PXSE to outside the pixel defining layer PDL. The pixel defining layer PDL may include an organic insulating material such as acrylic resin, epoxy resin, phenolic resin, polyamide resin, polyimide resin, unsaturated polyester resin, polyphenylene resin, polyphenylenesulfide resin or benzocyclobutene ("BCB"). The pixel defining layer PDL may include an inorganic material.

The pixel PX may include an emission region provided in plural including a plurality of emission regions at which light is emitted, and a non-emission region NEM provided in plural including a plurality of non-emission regions NEM at which light is not emitted. Portions of the pixel defining layer PDL correspond to the non-emission regions NEM. The emission regions may be distinguished by the pixel defining layer PDL and the open areas thereof.

The light emitting layer EML is disposed on the sub-pixel electrodes PXSE which are exposed to outside the pixel defining layer PDL. In an embodiment in which the display device 1 is an organic light emitting display, the light emitting layer EML may include an organic layer including an organic material. The organic layer further include a hole injection/transport layer and/or an electron injection/transport layer, as an auxiliary layer for assisting light emission. In an embodiment, when the display device 1 is a micro LED display, a nano LED display or the like, the light emitting layer EML may include an inorganic material such as an inorganic semiconductor.

In an embodiment, the light emitting layer EML may have a tandem structure in which a plurality of organic layers are superposed along the thickness direction and a charge generation layer is disposed between the organic layers. The respective organic layers superposed may emit light of the same wavelength, or may emit light of different wavelengths.

The light emitting layer EML may be provided in plural including a plurality of light emitting layers EML. Each of the light emitting layers EML may be a pattern of a light emitting material. The patterns may be respective portions of a same light emitting material layer.

In an embodiment, the wavelengths of light respectively emitted from the light emitting layers EML may be the same regardless of the sub-pixels PXS. In an embodiment, for example, the light emitting layer EML of each of the sub-pixels PXS may emit blue light or ultraviolet rays, and the color control structure in the pixel PX may include a wavelength conversion layer, thereby displaying a color for each of the sub-pixels PXS.

In an embodiment, the wavelength of light respectively emitted from each light emitting layer EML may be different for each color of the pixels PX. In an embodiment, for example, the light emitting layer EML of the first sub-pixel PXS_1 may emit light of a first color, the light emitting layer EML of the second sub-pixel PXS_2 may emit light of a second color, and the light emitting layer EML of the third sub-pixel PXS_3 may emit light of a third color.

A common electrode CME may be disposed on the light emitting layers EML. The common electrode CME may be in contact with the light emitting layers EML as well as the top surface of the pixel defining layer PDL.

The common electrode CME may be continuous across the sub-pixels PXS. The common electrode CME may be a full surface electrode disposed over an entirety of the sub-pixels PXS without distinguishing the sub-pixels PXS from each other. The common electrode CME may be a second electrode (e.g., a cathode electrode) of a light emitting diode.

The common electrode CME may include a material layer having a low work function, such as Li, Ca, LiF/Ca, LiF/Al, Al, Mg, Ag, Pt, Pd, Ni, Au Nd, Ir, Cr, BaF, Ba or a combination thereof (e.g., Ag and Mg). The common electrode CME may further include a transparent metal oxide layer disposed on the material layer which has a low work function.

The sub-pixel electrode PXSE, the light emitting layer EML and the common electrode CME may together constitute a light emitting element (e.g., an organic light emitting diode "OLED"). Light emitted from the light emitting layer EML may be emitted upward, in a direction away from the first substrate 110, and through the common electrode CME.

A thin film encapsulation structure 120 (e.g., encapsulation layer) may be disposed on the common electrode CME. The thin film encapsulation structure 120 may include at least one thin film encapsulation layer. In an embodiment, for example, the thin film encapsulation layer may include a first inorganic film 121 (e.g., first inorganic layer), an organic film 122 (e.g., organic layer), and a second inorganic film 123 (e.g., second inorganic layer). Each of the first inorganic film 121 and the second inorganic film 123 may include silicon nitride, silicon oxide, silicon oxynitride or the like. The organic film 122 may include an organic insulating material such as acrylic resin, epoxy resin, phenolic resin, polyamide resin, polyimide resin, unsaturated polyester resin, polyphenylene resin, polyphenylenesulfide resin or benzocyclobutene ("BCB").

The second display substrate 20 may be disposed above the thin film encapsulation structure 120 to face the thin film encapsulation structure 120. When sequentially describing the cross-sectional structure of the second display substrate 20 in a downward direction in FIG. 4, a second substrate 210 of the second display substrate 20 may include a transparent material. The second substrate 210 may include a transparent insulating material such as glass, quartz or the like. The second substrate 210 may be a rigid substrate. However, the second substrate 210 is not limited to the exemplified one. The second substrate 210 may include plastic such as polyimide or the like, and may have a flexible property so as to be bendable, foldable or rollable.

The second substrate 210 may be the same as the first substrate 110, but may have a different material, thickness, transmittance and the like. In an embodiment, for example, the second substrate 210 may have a higher transmittance than a transmittance of the first substrate 110. The second substrate 210 may be thicker or thinner than the first substrate 110.

A color filter layer CFL may be disposed on one surface of the second substrate 210. Each color filter pattern within the color filter layer CFL may include a colorant such as a dye or a pigment that absorbs wavelengths other than the corresponding color wavelength. The color filter layer CFL may serve to block the emission of light of a color other than the corresponding color of each of the sub-pixels PXS. That is, the color filter layer CFL may selectively transmit light of a specific color.

The color filter layer CFL may include a first color filter layer CFL_1 (e.g., first color filter pattern), a second color filter layer CFL_2 (e.g., a second color filter pattern), and a third color filter layer CFL_3 (e.g., third color filter pattern). The first color filter layer CFL_1 may be a red color filter layer, the second color filter layer CFL_2 may be a green color filter layer, and the third color filter layer CFL_3 may be a blue color filter layer. That is, the first color filter layer CFL_1 may selectively transmit red light, the second color filter layer CFL_2 may selectively transmit green light, and the third color filter layer CFL_3 may selectively transmit blue light.

The first color filter layer CFL_1 may be disposed in the first sub-pixel PXS_1, the second color filter layer CFL_2 may be disposed in the second sub-pixel PXS_2, and the third color filter layer CFL_3 may be disposed in the third sub-pixel PXS_3. Further, the first color filter layer CFL_1, the second color filter layer CFL_2, and the third color filter layer CFL_3 may be disposed in the light blocking region BA. That is, the first color filter layer CFL_1, the second color filter layer CFL_2, and the third color filter layer CFL_3 may be disposed not only in the light transmission regions TA of each of the sub-pixels PXS, but also over an entirety of the light blocking region BA of one of the pixels PX. In other words, any one of the first color filter layer CFL_1, the second color filter layer CFL_2, and the third color filter layer CFL_3 may be disposed in the light transmission regions TA of one of the pixels PX, and all of the first color filter layer CFL_1, the second color filter layer CFL_2 and the third color filter layer CFL_3 may be disposed in the light blocking region BA of the one of the pixels PX.

The first color filter layer CFL_1 may be disposed in the first light transmission region TA1, the second color filter layer CFL_2 may be disposed in the second light transmission region TA2, and the third color filter layer CFL_3 may be disposed in the third light transmission region TA3.

In the light blocking region BA, portions of the first color filter layer CFL_1, the second color filter layer CFL_2 and the third color filter layer CFL_3 are disposed. Referring to FIG. 4, the third color filter layer CFL_3 may be disposed on the second substrate 210, the first color filter layer CFL_1 may be disposed on the third color filter layer CFL_3, and the second color filter layer CFL_2 may be disposed on the first color filter layer CFL_1. In the light blocking region BA, the color filter layers CFL may be arranged in the order of the third color filter layer CFL_3, the first color filter layer CFL_1, and the second color filter layer CFL_2 in the downward direction (e.g., in a direction away from the second substrate 210). In the light blocking region BA, the first color filter layer CFL_1, the second color filter layer CFL_2, and the third color filter layer CFL_3 may overlap or correspond to each other along a thickness direction of the display device 1. That is, at a same location within the light blocking region BA, the first color filter pattern, the second color filter pattern and the third color filter pattern overlap each other.

Since the first color filter layer CFL_1, the second color filter layer CFL_2, and the third color filter layer CFL_3 are each disposed in the light blocking region BA, light emission from the display device 1 may be blocked in the light blocking region BA, and reflection of external light may be suppressed. Each of the first color filter layer CFL_1, the second color filter layer CFL_2, and the third color filter layer CFL_3 blocks the emission of light of a color other than the corresponding color of each of the sub-pixels PXS, and accordingly, red, green and blue light may all be blocked at the light blocking region BA.

In an embodiment, an upper light absorbing member (not shown) may be disposed on the second substrate 210. The upper light absorbing member (not shown) may overlap or correspond to portions of the pixel defining layer PDL of the first display substrate 10 and be positioned in the non-emission regions NEM. The upper light absorbing member (not shown) may include a light absorbing material that absorbs a visible light wavelength band. In an embodiment, for example, the upper light absorbing member (not shown) may include be made of a material used as a black matrix of the display device 1. The upper light absorbing member (not shown) may be a type of light blocking member.

A low refractive film LRL (e.g., low refractive index layer) may be disposed on the color filter layer CFL. The low refractive film LRL may be disposed over the light transmission regions TA and the light blocking region BA. The low refractive film LRL may have a lower refractive index than a refractive index of a color control layer including a first wavelength conversion pattern WCL1, a second wavelength conversion pattern WCL2 and a light transmitting layer TPL (e.g., light transmitting pattern). In an embodiment, for example, the low refractive film LRL may have a refractive index of about 1.1 or more and about 1.4 or less.

The low refractive film LRL may reflect a portion of the light emitted toward the second substrate 210 from the color control layer and back to the color control layer. That is, the low refractive film LRL may recycle at least a portion of the light that is emitted toward the second substrate 210 through the color control layer, thereby improving light utilization efficiency, and as a result, the light efficiency of the display device 1 can be improved.

The low refractive film LRL includes an organic material and may further include particles dispersed therein. The particles included in the low refractive film LRL may be at least any one of zinc oxide (ZnO) particles, titanium dioxide ($TiO_2$) particles, hollow silica particles, non-hollow silica particles, nano silicate particles and porogen particles.

When the low refractive film LRL includes or is made of an organic material film, a bottom surface which is furthest from the second substrate 210 may be flat despite having an upper surface which is opposite to the bottom surface and stepped (e.g., non-flat). The low refractive film LRL may completely cover the bottom surface of the color filter layer CFL. Despite the height difference between the color filter layer CFL disposed in the light transmission regions TA and the color filter layer CFL disposed in the light blocking region BA, the bottom surface of the low refractive film LRL may be substantially flat.

A first capping layer CPL1 may be disposed on the low refractive film LRL. The first capping layer CPL1 may reduce or effectively prevent impurities such as moisture or air from permeating from outside and damaging or contaminating the color filter layer CFL and the low refractive film LRL. Further, the first capping layer CPL1 may reduce or effectively prevent the colorants of the color filter layer CFL from being diffused into other components.

The first capping layer CPL1 may directly contact one surface (the bottom surface in FIG. 4) of the low refractive film LRL. The first capping layer CPL1 may include or be made of an inorganic material. In an embodiment, for example, the first capping layer CPL1 may include silicon nitride, aluminum nitride, zirconium nitride, titanium nitride, hafnium nitride, tantalum nitride, silicon oxide, aluminum oxide, titanium oxide, tin oxide, silicon oxynitride or the like.

A bank layer MBM is disposed on the first capping layer CPL1. The bank layer MBM may include an organic material. The bank layer MBM may include a light absorbing material that absorbs a visible light wavelength band. In an embodiment, the bank layer MBM may include an organic light blocking material. The bank layer MBM may be a type of light blocking member. The bank layer MBM is disposed along the boundaries of the sub-pixels PXS within one of the pixels PX, and each of the sub-pixels PXS may be distinguished by the bank layer MBM.

The bank layer MBM may define the light blocking region BA and the light transmission regions TA. The planar area corresponding to a planar area of the bank layer MBM becomes the light blocking region BA. The color control layer that is not covered by the bank layer MBM or is exposed by the bank layer MBM to outside thereof, may be the light transmission regions TA. The bank layer MBM includes or is made of a material capable of blocking light transmission, and serves to reduce or effectively prevent invasion of light from one of the sub-pixels PXS into sub-pixels PXS which are adjacent thereto and causing color mixing. In addition, in the process of providing or forming the color control layer to be described later, when the color control layer is provided or formed by a method such as an inkjet process, the bank layer MBM may serve as a partition wall that guides a material of the color control layer (e.g., an ink composition) to be injected stably to a corresponding position.

The bank layer MBM may include or define a plurality of holes penetrating the bank layer MBM along the thickness direction. The plurality of holes may be spaced apart from each other in a direction along the second substrate 210. The color control layer or the spacer CS may be disposed in the plurality of holes defined by the bank layer MBM. Hereinafter, for simplicity of description, a hole in which the color control layer is disposed is referred to as an opening, and a hole in which the spacer CS is disposed is referred to as the through hole HLE.

Referring to FIG. 4, for example, the display device 1 includes the bank layer MBM facing the second substrate 210 with a first color filter pattern therebetween (e.g., one of the first color filter layer CFL_1, the second color filter layer CFL_2 and the third color filter layer CFL_3). In the light transmission region TA, a first opening (e.g., any one of the openings OP1, OP2, OP3) is defined in the bank layer MBM and a wavelength control pattern is in the first opening of the bank layer MBM. In the light blocking region BA, a second opening (e.g., the through hole HLE) is defined in the bank layer MBM and is spaced apart from the first opening, where the spacer CS is in the second opening of the bank layer MBM.

The bank layer MBM may define the opening provided in plural including a plurality of openings OP1, OP2, OP3 that partially exposes the first capping layer CPL1 to outside the bank layer MBM. The openings OP1, OP2, OP3 are disposed in the light transmission regions TA and may overlap the light transmission regions TA along the thickness direction. The openings OP1, OP2, OP3 may overlap the color filter layer CFL along the thickness direction. The color filter layer CFL overlapping the openings OP1, OP2, OP3 may be any one of the first color filter layer CFL_1, the second color filter layer CFL_2 and the third color filter layer CFL_3. That is, the openings OP1, OP2, OP3 defined by the bank layer MBM may be provided in plural, and each of the plurality of openings OP1, OP2, and OP3 may overlap any one of the first color filter layer CFL_1, the second color filter layer CFL_2, and the third color filter layer CFL_3.

One surface of the bank layer MBM may protrude along the thickness direction as compared to corresponding surface of the color control layer, but the disclosure is not limited thereto. Referring to FIG. 4, for example, at corresponding upper surface of the bank layer MBM and the color control layer, the bank layer MBM protrudes further than the upper surface of the color control layer to define a protruded portion of the bank layer MBM. The protruded portion has a height or thickness taken from the upper surface of the respective color control layer pattern. The height (or thickness) of the bank layer MBM which protrudes from a first wavelength conversion pattern WCL1, a second wavelength conversion pattern WCL2 and the light transmitting layer TPL of the color control layer, may be about 1 micrometer (μm) to about 3 micrometers (μm), about 1.4 μm to about 1.8 μm, or about 1.6 μm. However, the disclosure is not limited thereto.

Figure 5:
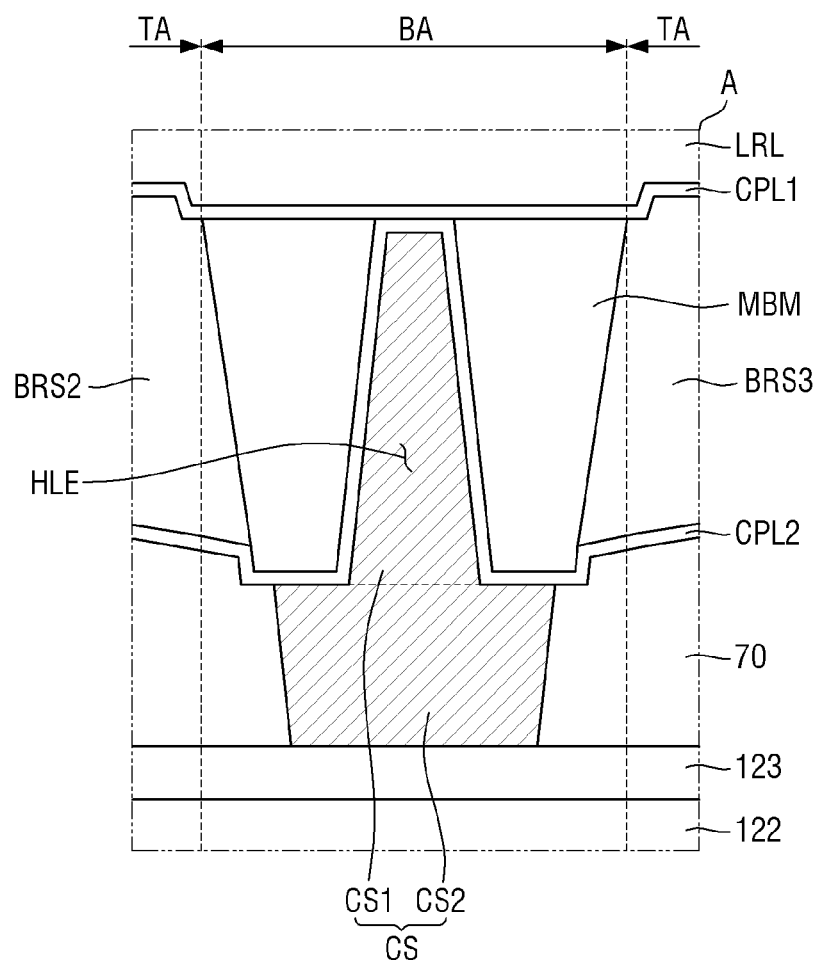
FIG. 5 is an enlarged cross-sectional view of area A of FIG. 4.

The bank layer MBM may further include or define the through hole HLE in addition to the openings OP1, OP2, and OP3. FIG. 5 is further referred to describe the through hole HLE in more detail.

FIG. 5 is an enlarged cross-sectional view of area A of FIG. 4.

Referring to FIG. 5, the bank layer MBM may include the through hole HLE penetrating the bank layer MBM along the thickness direction. That is, the through hole HLE may be defined by portions of the bank layer MBM. The through hole HLE is disposed in the light blocking region BA and may overlap the light blocking region BA along the thickness direction. The through hole HLE may expose the first capping layer CPL1 to outside the bank layer MBM. The through hole HLE may overlap the first color filter layer CFL_1, the second color filter layer CFL_2, and the third color filter layer CFL_3 along the thickness direction. The through hole HLE may not overlap the openings OP1, OP2, and OP3.

Since the through hole HLE is disposed in the bank layer MBM, the height (or total thickness TH) of the color control layer can be more accurately measured. The openings OP1, OP2, and OP3 and the through hole HLE defined by the bank layer MBM may expose the first capping layer CPL1 to outside the bank layer MBM. The first capping layer CPL1 is disposed on the low refractive film LRL, and may be substantially flat despite the stepped portion thereunder.

One surface (the bottom surface which is furthest from the second substrate 210) of the first capping layer CPL1 and respectively exposed by the openings OP1, OP2, and OP3 and the through hole HLE defined by the bank layer MBM, may be substantially flat. That is, even if the color control layer is disposed in the openings OP1, OP2, and OP3, a reference surface for measuring the total thickness TH of the color control layer may be set as the bottom surface of the first capping layer CPL1 which is exposed at the through hole HLE, and thus the total thickness TH of the first wavelength conversion pattern WCL1, the second wavelength conversion pattern WCL2 and/or the light transmitting layer TPL of the color control layer can be more accurately measured, respectively. Therefore, a variation in height (or total thickness TH) of patterns providing the color control layer may be suppressed to prevent defects. This will be described in detail later.

The inside of the through hole HLE may be filled with a second capping layer CPL2 and the spacer CS. That is, the spacer CS may fill the inside of the through hole HLE. An inner wall of the bank layer MBM may define the through hole HLE. The second capping layer CPL2 may be disposed on the inner wall at the through hole HLE and on the bottom surface of the first capping layer CPL1 which is exposed outside of the bank layer MBM by the through hole HLE.

The second capping layer CPL2 may directly contact the first capping layer CPL1 at the through hole HLE. That is, at a location corresponding to the second opening (e.g., the through hole HLE), the first capping layer CPL1 and the second capping layer CPL2 may directly contact each other. At least a portion of the second capping layer CPL2 may be disposed on the inner wall of the bank layer MBM at the through hole HLE thereof, and the spacer CS may be disposed on the second capping layer CPL2. The second capping layer CPL2 may not fill an entire volume of the through hole HLE. Where the second capping layer CPL2 does not fill an entire volume of the through hole HLE, at least a portion of the spacer CS may occupy a partial volume of the through hole HLE to at least partially fill the through hole HLE.

The spacer CS may be disposed on the second capping layer CPL2. The spacer CS may include a filling portion such as a first filling portion CS1 (e.g. first portion) positioned inside the through hole HLE and a protrusion such as a first protrusion CS2 (e.g., second portion) which extends out of the through hole HLE to be positioned outside the through hole HLE. The first protrusion CS2 may protrude downward from one surface (the bottom surface) of the bank layer MBM, and may protrude downward from one surface (the bottom surface) of the second capping layer CPL2. That is, a portion of the spacer CS may fill the inside of the through hole HLE while the remaining portion of the spacer CS may protrude below the bank layer MBM. A dimension of the first protrusion CS2 may be larger than a dimension of the through hole HLE, in a plan view. A portion of the first protrusion CS2 may be disposed on the bottom surface of the bank layer MBM. The first filling portion CS1 and the first protrusion CS2 of the spacer CS may be integrally formed.

The spacer CS may be disposed in the light blocking region BA. The spacer CS is disposed in the light blocking region BA, and may not overlap the light transmission regions TA. In addition, the spacer CS may not overlap the color control layer, but is not limited thereto. The spacer CS may overlap the first capping layer CPL1, the second capping layer CPL2 and the low refractive film LRL along the thickness direction.

The spacer CS may serve to maintain a gap with a structure disposed thereabove. In an embodiment, for example, the spacer CS may serve to maintain a cell gap (or distance) between the first display substrate 10 and the second display substrate 20, along the thickness direction. The spacer CS may directly contact the second inorganic film 123 of the first display substrate 10.

The spacer CS is disposed between the second substrate 210 of the second display substrate 20 and the first display substrate 10 to maintain a gap between the two members, thereby uniformly maintaining an overall thickness of each region of the display device 1 (see FIG. 1). Accordingly, stains that may occur due to a non-uniform gap between the first display substrate 10 and the second display substrate 20 may be reduced. In addition, since the spacer CS is disposed inside the through hole HLE to fill the inside of the through hole HLE, air bubbles or the like that may be generated at the through hole HLE in the process of providing the filling layer 70 may be reduced or effectively prevented. Therefore, even if the through hole HLE is disposed in the bank layer MBM, since the through hole HLE is filled with the spacer CS, a defect that may be caused by the through hole HLE may be reduced or effectively prevented.

Referring to FIG. 4 again, the color control layer (or a wavelength control pattern) is disposed in the openings OP1, OP2, and OP3 defined by the bank layer MBM. The color control layer may include a wavelength conversion layer that converts the wavelength of the incident light and/or a light transmitting layer TPL that maintains and transmits the wavelength of the incident light passing therethrough. The wavelength conversion layer or the light transmitting layer TPL may be disposed to be separated for each of the sub-pixels PXS. The wavelength conversion layer or the light transmitting layer TPL may respectively overlap the emission regions and the light transmission regions TA along the thickness direction. The adjacent wavelength conversion layer or the light transmitting layer TPL may be spaced apart from each other in a direction along the second substrate 210. A space between these elements may overlap or correspond to the light blocking region BA.

The wavelength conversion layer may be disposed in the sub-pixels PXS in which the wavelength of light incident from the light emitting layer EML is converted due to the difference from the color of the corresponding one of the sub-pixels PXS. The light transmitting layer TPL may be disposed in the sub-pixel PXS in which the wavelength of light incident from the light emitting layer EML is the same as the color of the corresponding one of the sub-pixels PXS.

In FIG. 4, the light emitting layer EML of each of the sub-pixels PXS emits light of a third color, the wavelength conversion layer is disposed in the first sub-pixel PXS_1 and the second sub-pixel PXS_2, and the light transmitting layer TPL is disposed in the third sub-pixel PXS_3. In an embodiment, when the light emitting layer EML of each of the sub-pixels PXS emits light, such as ultraviolet rays having a wavelength different from the color of each of the sub-pixels PXS, only the first wavelength conversion pattern WCL1 and the second wavelength conversion pattern WCL2 may be provided, while omitting the light transmitting layer TPL. In an embodiment, when the light emitting layer EML of each the sub-pixels PXS emits light corresponding to the color of each of the sub-pixels PXS, only the light transmitting layer TPL may be provided while omitting the wavelength conversion layer, or the light transmitting layer TPL may be omitted in all of the sub-pixels PXS.

Referring again to FIG. 4, the wavelength conversion layer may include a first wavelength conversion pattern WCL1 disposed in the first sub-pixel PXS_1 and a second wavelength conversion pattern WCL2 disposed in the second sub-pixel PXS_2.

The first wavelength conversion pattern WCL1 may be provided in at a first opening (OP1) of the bank layer MBM. The first wavelength conversion pattern WCL1 may include a first base resin BRS1 and a first wavelength conversion material WCP1 which is provided in the first base resin BRS1. The second wavelength conversion pattern WCL2 may be provided in a first opening (OP2) of the bank layer MBM. The second wavelength conversion pattern WCL2 may include a second base resin BRS2 and a second wavelength conversion material WCP2 which is provided in the second base resin BRS2. The light transmitting layer TPL may be provided in a first opening (OP3) of the bank layer MBM. The light transmitting layer TPL may include a third base resin BRS3 and a light scatterer SCP provided in plural including scatterers SCP which are provided in the third base resin BRS3.

The first to third base resins BRS1, BRS2 and BRS3 may include a light-transmitting organic material. In an embodiment, for example, the first to third base resins BRS1, BRS2 and BRS3 may include an epoxy resin, an acrylic resin, a cardo resin, an imide resin or the like. The first to third base resins BRS1, BRS2 and BRS3 may include or be formed of the same material, but the disclosure is not limited thereto.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first wavelength conversion material WCP1 may convert blue light into red light, and the second wavelength conversion material WCP2 may convert blue light into green light. The first wavelength conversion material WCP1 and the second wavelength conversion material WCP2 may be quantum dots, quantum bars, phosphors or the like. Examples of the quantum dots may include group IV nanocrystals, group II-VI compound nanocrystals, group III-V compound nanocrystals, group IV-VI nanocrystals, and combinations thereof. The first wavelength conversion pattern WCL1 and the second wavelength conversion pattern WCL2 may further include scatterers SCP for increasing wavelength conversion efficiency.

The light transmitting layer TPL disposed in the third sub-pixel PXS_3 transmits blue light incident from the light emitting layer EML while maintaining the wavelength thereof. The scatterers SCP of the light transmitting layer TPL may scatter the light, and serve to control an emission angle of the light emitted through the light transmitting layer TPL. The light transmitting layer TPL may not include a wavelength conversion material.

The second capping layer CPL2 is disposed on the wavelength conversion layer and the light transmitting layer TPL. The second capping layer CPL2 may include or be formed of an inorganic material. The second capping layer CPL2 may include a material selected from the above-mentioned materials of the first capping layer CPL1. The second capping layer CPL2 and the first capping layer CPL1 may include or be made of the same material, but are not limited thereto.

The second capping layer CPL2 may cover the wavelength conversion patterns WCL1 and WCL2, the light transmitting layer TPL, and the bank layer MBM. The second capping layer CPL2 may cover corresponding surfaces of each of the wavelength conversion patterns WCL1 and WCL2 and the light transmitting layer TPL. The second capping layer CPL2 may cover not only one surface of the bank layer MBM but also the side surface thereof at the through hole HLE. The second capping layer CPL2 may have a conformal shape with respect to the surface height difference formed by the color control layer and the bank layer MBM which are adjacent to each other.

The filling layer 70 may be disposed between the first display substrate 10 and the second display substrate 20. The filling layer 70 may fill a space between the first display substrate 10 and the second display substrate 20, and may serve to bond them to each other. The filling layer 70 may be disposed between the thin film encapsulation structure 120 of the first display substrate 10 and the second capping layer CPL2 of the second display substrate 20. The filling layer 70 may include or be formed of a Si-based organic material, an epoxy-based organic material, or the like, but is not limited thereto.

Hereinafter, a method of providing or fabricating the display device 1 will be described.

FIGS. 6 to 10 are cross-sectional views showing structures in an embodiment of a method of forming a display device 1. FIGS. 6 to 10 illustrate processes for forming the second display substrate 20 (see FIG. 1). In FIGS. 6 to 10, for simplicity of description, the second display substrate 20 (see FIG. 1) of FIG. 4 is illustrated in an upside-down shape.

Figure 6:
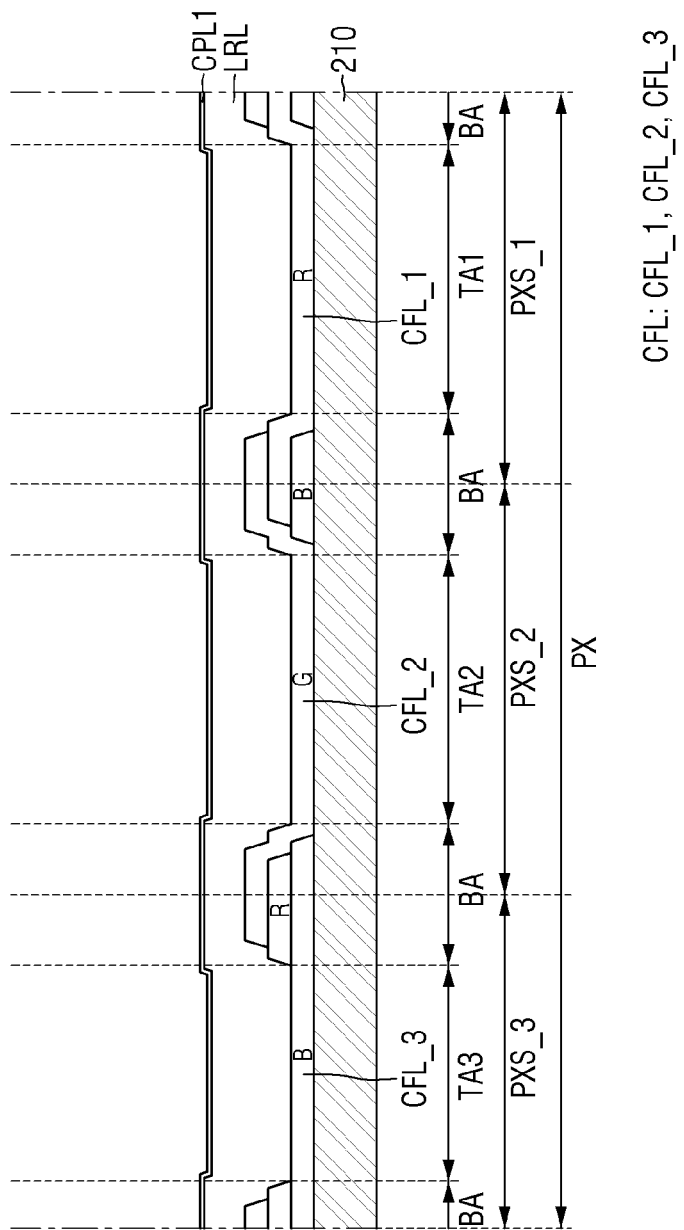
FIGS. 6 to 10 are cross-sectional views showing processes in an embodiment of a method of providing a display device.

Referring to FIG. 6, the color filter layer CFL is provided or formed on a surface of the second substrate 210 of the second display substrate 20 (see FIG. 4).

Specifically, the color filter layer CFL may include the first color filter layer CFL_1, the second color filter layer CFL_2, and the third color filter layer CFL_3. The color filter layer CFL, e.g., the first to third color filter layers CFL_1, CFL_2, and CFL_3 may be provided or formed by applying a photosensitive organic material including a color material of a specific color and then exposing and developing the organic material. The first to third color filter layers CFL_1, CFL_2, and CFL_3 may be provided or formed in the order of the third color filter layer CFL_3, the first color filter layer CFL_1, and the second color filter layer CFL_2, without being limited thereto.

The third color filter layer CFL_3 may be provided or formed by applying a photosensitive organic material including a third color material and then patterning the photosensitive organic material by exposing and developing. In an embodiment, for example, a photosensitive organic material including a blue color material is applied and then exposed and developed to provide the third color filter layer CFL_3 as a pattern of the photosensitive organic material. As a result, as shown in FIG. 6, the third color filter layer CFL_3 which is patterned may be provided or formed. The first color filter layer CFL_1 and the second color filter layer CFL_2 may be provided or formed in substantially the same way as the process of providing or forming the third color filter layer CFL_3.

After forming the third color filter layer CFL_3, the first color filter layer CFL_1 is provided or formed. As shown in FIG. 6, the first color filter layer CFL_1 may be formed by applying a photosensitive organic material including a first color material and then exposing and developing the photosensitive organic material. After forming the first color filter layer CFL_1, the second color filter layer CFL_2 is provided or formed. As shown in FIG. 6, the second color filter layer CFL_2 may be formed by applying a photosensitive organic material including a second color material and then exposing and developing the photosensitive organic material. In an embodiment, for example, the first color filter layer CFL_1 may include a red color material, and the second color filter layer CFL_2 may include a green color material.

As the third color filter layer CFL_3, the first color filter layer CFL_1, and the second color filter layer CFL_2 are sequentially provided or formed on the second substrate 210, individual material layers of the color filter layer CFL may be stacked in some regions in the order of the third color filter layer CFL_3, the first color filter layer CFL_1, and the second color filter layer CFL_2. However, the order of providing or forming the color filter layers CFL is not limited thereto.

Subsequently, the low refractive film LRL and the first capping layer CPL1 are provided or formed on the color filter layer CFL to cover the color filter layer CFL. The low refractive film LRL and the first capping layer CPL1 may be disposed over the entire area of the second substrate 210.

Figure 7:
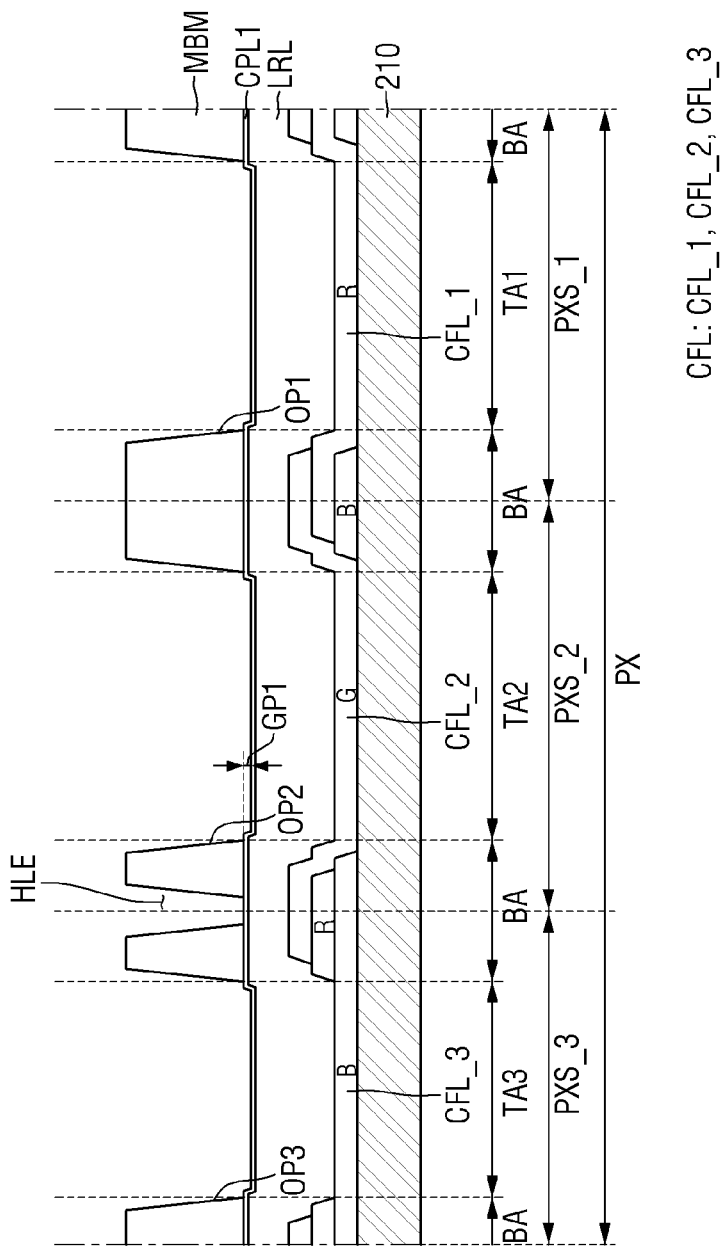

Referring to FIG. 7, the bank layer MBM is provided or formed on the first capping layer CPL1.

Specifically, the bank layer MBM which is patterned may be provided or formed on the first capping layer CPL1. Solid portions of the bank layer MBM may be disposed in the light blocking region BA. The bank layer MBM may be provided or formed through an exposure and development process, to provide patterns of the bank layer MBM. In an embodiment, for example, the bank layer MBM may include an organic material, and the organic material may be a photosensitive organic material. The bank layer MBM may be provided or formed by applying an organic material layer and then exposing and developing the organic material layer to form patterns of the bank layer MBM. The organic material layer for providing the bank layer MBM may include or be made of a negative photosensitive material which is cured by irradiation with light, but is not limited thereto.

The first capping layer CPL1 may include a bottom surface furthest from the second substrate 210. The bottom surface may have two portions at different distances from the second substrate 210 to define a difference in height between the two portions. A first bottom surface may be exposed to outside the bank layer MBM at the openings OP1, OP2, and OP3 and a second bottom surface may be exposed to outside the bank layer MBM at the through hole HLE.

There may be a first height difference GP1 between the first bottom surface of the first capping layer CPL1 which is exposed by the openings OP1, OP2, and OP3 defined by the bank layer MBM and the second bottom surface of the first capping layer CPL1 which is exposed by the through hole HLE defined by the bank layer MBM.

In an embodiment of the method, after the bank layer MBM is patterned, the first height difference GP1 may be measured. The method for measuring the first height difference GP1 may include an optical method and/or a physical method. The optical method may include a white light scanning method or the like. As the first height difference GP1 is defined, the height (or total thickness TH) of the color control layer may be more accurately measured. However, the process of measuring the first height difference GP1 may be omitted.

In the process of providing or forming the bank layer MBM, the through hole HLE defined by portions of the bank layer MBM may be defined together with the openings OP1, OP2, and OP3, by the same process. A separate mask for providing or forming the through hole HLE is obviated, and the number of masks required is reduced. Therefore, even if the through hole HLE is provided or formed in addition to the openings OP1, OP2, and OP3, the number of processes does not increase, and thus the process efficiency and the process cost may not increase.

Figure 8:
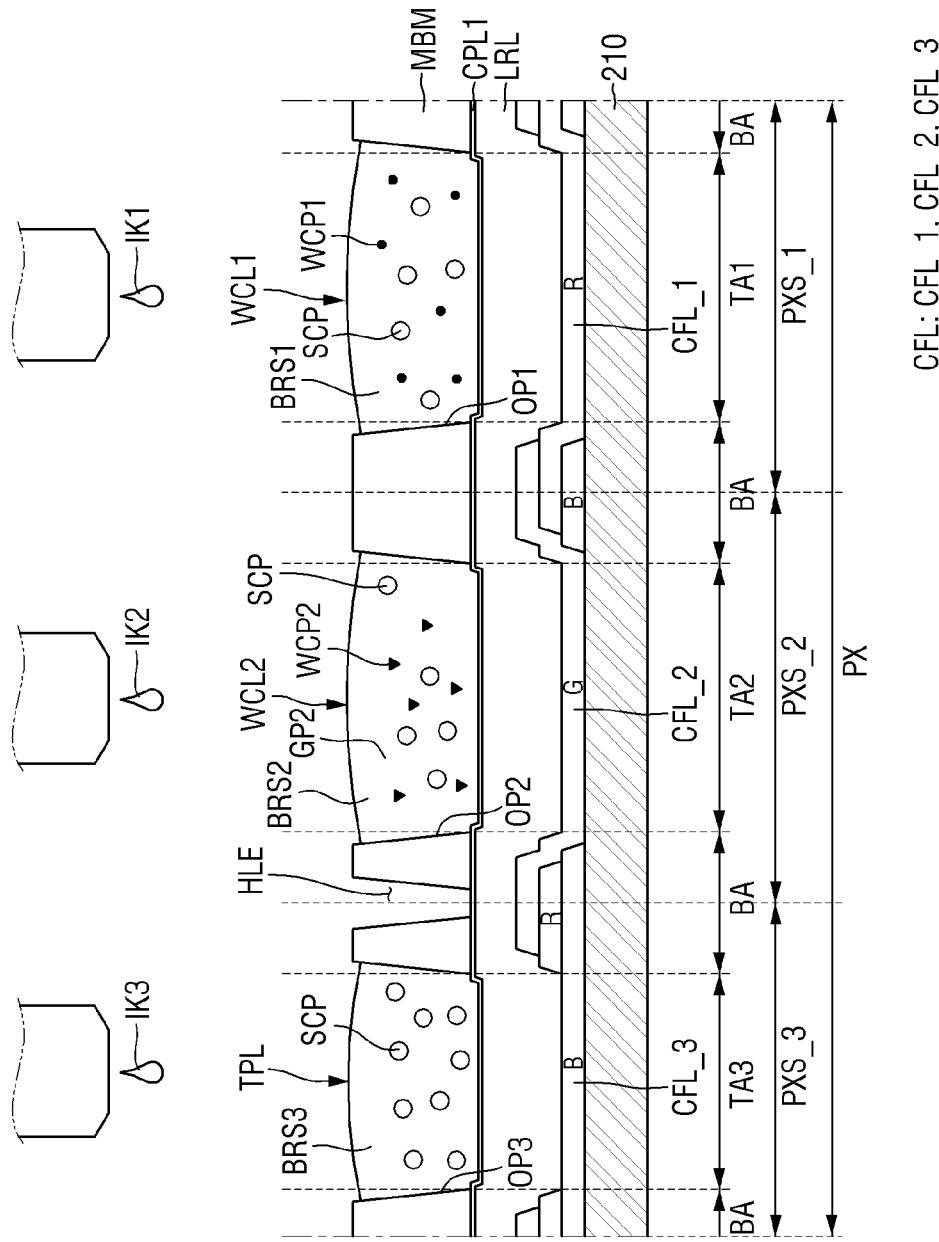

Referring to FIG. 8, patterns of the color control layer are respectively provided or formed in the openings OP1, OP2, and OP3 defined by the patterned bank layer MBM. The color control layer may be provided or formed by an inkjet printing process using an inkjet composition.

Specifically, the first wavelength conversion pattern WCL1 of the color control layer may be provided or formed by injecting, to the first light transmission region TA1, a first ink IK1 including a material included in the first wavelength conversion pattern WCL1. The first ink IK1 may be injected into a respective opening among the openings OP1, OP2, and OP3 defined by the bank layer MBM, in an area overlapping the first light transmission region TA1. That is, the bank layer MBM may serve as a guide for stably positioning the first ink IK1 at a desired position in order to provide or form the first wavelength conversion pattern WCL1.

Similarly, the second wavelength conversion pattern WCL2 may be provided or formed by injecting, to the second light transmission region TA2, a second ink IK2 including a material included in the second wavelength conversion pattern WCL2. The second ink IK2 may be injected into a respective opening among the openings OP1, OP2, and OP3 defined by the bank layer MBM, in an area overlapping the second light transmission region TA2. That is, the bank layer MBM may serve as a guide for stably positioning the second ink IK2 at a desired position in order to provide or form the second wavelength conversion pattern WCL2.

Similarly, the light transmitting layer TPL of the color control layer may be provided or formed by injecting, to the third light transmission region TA3, a third ink IK3 including a material included in the light transmitting layer TPL. The third ink IK3 may be injected into a respective opening among the openings OP1, OP2, and OP3 defined by the bank layer MBM, in an area overlapping the third light transmission region TA3. That is, the bank layer MBM may serve as a guide for stably positioning the third ink IK3 at a desired position in order to provide or form the light transmitting layer TPL.

The injection amounts of the first to third inks IK1, IK2 and IK3 may be determined in consideration of the surface tension and/or the shrinkage of the volume after drying the first to third inks IK1, IK2 and IK3.

Figure 9:
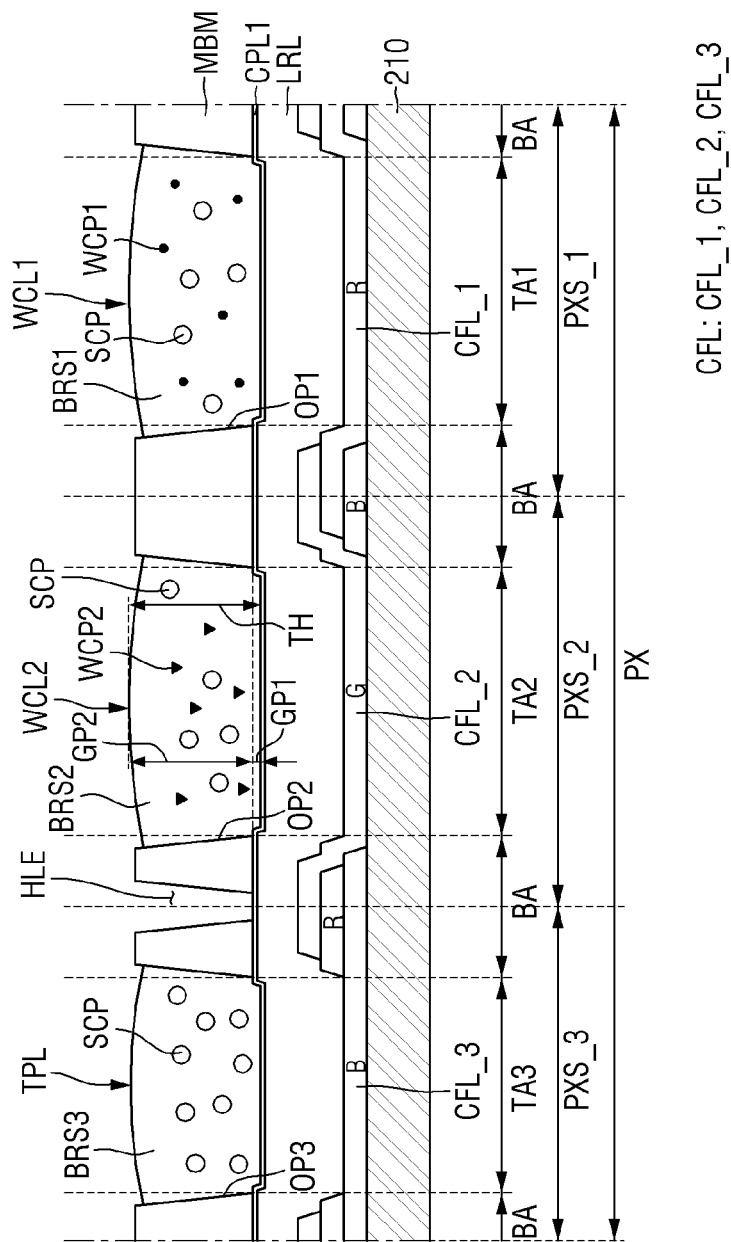

Referring to FIG. 9, the height (or total thickness TH) of the color control layer is measured using the through hole HLE of the bank layer MBM. FIG. 9 exemplarily shows that the height (or total thickness TH) of the second wavelength conversion pattern WCL2 is measured. However, the disclosure is not limited thereto, and the heights of the first wavelength conversion pattern WCL1 and the light transmitting layer TPL may be measured by the same method.

Specifically, the openings OP1, OP2, and OP3 and the through hole HLE defined by the bank layer MBM may expose the first capping layer CPL1 to outside the bank layer MBM. The first capping layer CPL1 is disposed on the low refractive film LRL, and may be substantially flat despite the stepped portion thereunder. That is, surfaces (the top surface in FIG. 9, the bottom surface in FIG. 4) of the first capping layer CPL1 which are exposed at the openings OP1, OP2, and OP3 and at the through hole HLE defined by the bank layer MBM, may be substantially flat, respectively.

Even if the second wavelength conversion pattern WCL2 is disposed in a respective one of the openings OP1, OP2, and OP3, the reference surface for measuring the height (or total thickness TH) of the second wavelength conversion pattern WCL2 may be set as surface portion (the top surface in FIG. 9, the bottom surface in FIG. 4) of the first capping layer CPL1 which is exposed at the through hole HLE, and thus, the height (or total thickness TH) of the second wavelength conversion pattern WCL2 may be directly measured. In other words, based on the surface portion (the top surface in FIG. 9, the bottom surface in FIG. 4) of the first capping layer CPL1 which is exposed at the through hole HLE, a second height difference GP2 (e.g., depth of the through hole HLE) between the surface portion surface (the top surface in FIG. 9, the bottom surface in FIG. 4) of the first capping layer CPL1 exposed by the through hole HLE and a corresponding top surface (the top surface in FIG. 9) of the second wavelength conversion pattern WCL2 may be directly measured. That is, the providing of the color control layer in a first opening (e.g., a respective one of the openings OP1, OP2, and OP3) may include providing the total thickness TH based on a depth of the second opening (e.g., the through hole HLE).

The method for measuring the second height difference GP2 may include an optical method and/or a physical method, without being limited thereto. The optical method may include a white light scanning method or the like. Since the method for measuring the height (or total thickness TH) using the white light scanning method is well known in the art, a detailed description thereof will be omitted.

As the through hole HLE is further provided or formed in the bank layer MBM, the height (or total thickness TH) of the color control layer may be more accurately measured. Therefore, suppressing or preventing a phenomenon in which luminance becomes non-uniform due to the variation in height (or total thickness TH) of the color control layer may be possible. Further, the height (or total thickness TH) of the color control layer can be more smoothly controlled, thereby improving the color reproduction rate.

Furthermore, as described above, in FIGS. 7 and 9, when the first height difference GP1 between the first top surface of the first capping layer CPL1 which is exposed at the openings OP1, OP2 and OP3 defined by the bank layer MBM and the second top surface of the first capping layer CPL1 which is exposed at the through hole HLE defined by the bank layer MBM is measured, the first height difference GP1 may be aggregated with the second height difference GP2 between the second top surface (the top surface in FIG. 9, the bottom surface in FIG. 4) of the first capping layer CPL1 which is exposed by the through hole HLE and a corresponding top surface (the top surface in FIG. 9) of the second wavelength conversion pattern WCL2 to more accurately measure the height (or total thickness TH) of the second wavelength conversion pattern WCL2. That is, the total thickness TH may be a sum of the first height difference GP1 and the second height difference GP2.

Figure 10:
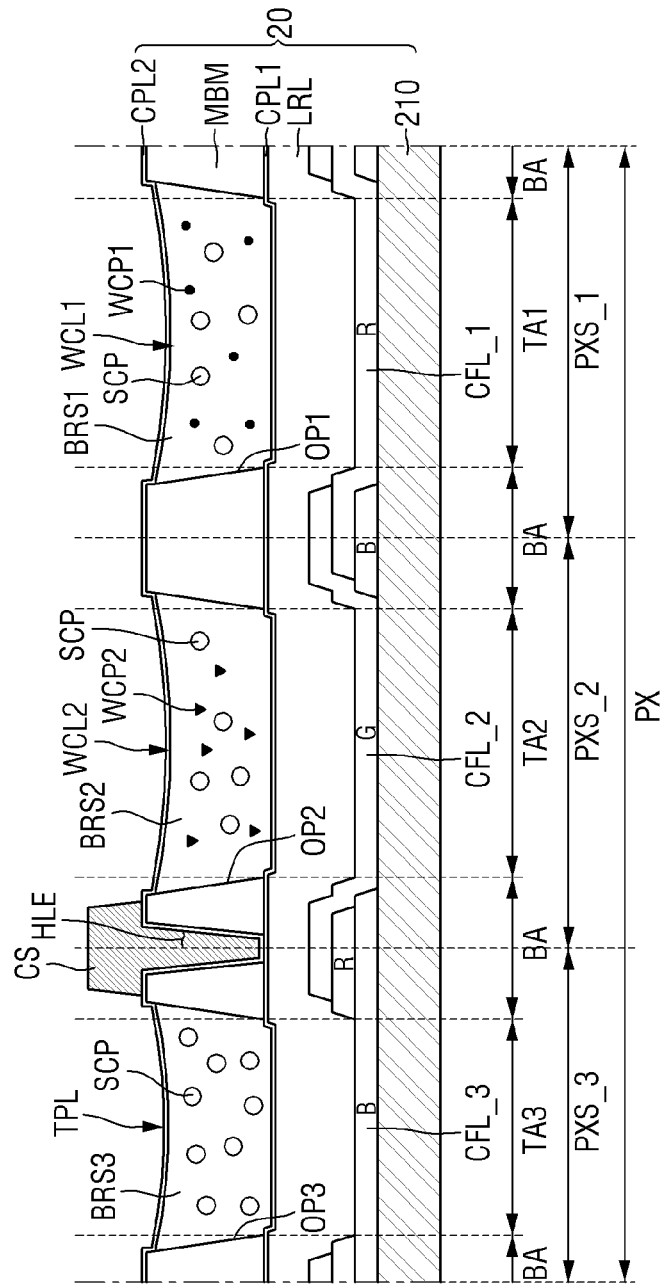

Referring to FIG. 10, the second capping layer CPL2 is provided or formed on the bank layer MBM and the color control layer, and the inside of the through hole HLE is filled with the spacer CS.

Specifically, the material of the color control layer may be cured. By the curing of the material of the color control layer, the first wavelength conversion pattern WCL1, the second wavelength conversion pattern WCL2 and the light transmitting layer TPL may shrink. After curing of the material of the color control layer, the second capping layer CPL2 may be provided or formed. The second capping layer CPL2 may be provided or formed over the entire area of the second substrate 210.

The spacer CS may be provided or formed on the second capping layer CPL2. The spacer CS may be disposed in the light blocking region BA. The spacer CS may be provided or formed through an exposure and development process. In an embodiment, for example, the spacer CS may include an organic material, and the organic material may be a photosensitive organic material. In an embodiment, the spacer CS may be provided or formed by applying an organic material layer and then exposing and developing the organic layer. In the process of applying the organic material layer, the organic material layer may fill the inside of the through hole HLE. The organic material layer spacer may be a negative photosensitive material which is cured at a portion thereof which is irradiated with light, but is not limited thereto.

In an embodiment, the wavelength control pattern includes a wavelength conversion material or a light scatterer SCP, and the spacer CS excludes both the wavelength conversion material and the light scatterer SCP.

As the inside of the through hole HLE is filled with the spacer CS, air bubbles that may be generated when the through hole HLE is not filled enough with the filling layer 70 may be reduced or effectively prevented, and defects that may be caused by the air bubbles may also be reduced or prevented. Further, as the inside of the through hole HLE is completely filled with the spacer CS, a separate process for filling the inside of the through hole HLE is unnecessary. Therefore, even if the through hole HLE is provided or formed, the number of processes does not increase, and thus the process efficiency and the process cost may also not increase.

Referring again to FIG. 4, the filling layer 70 is coated on the second capping layer CPL2 and the spacer CS, and the first display substrate 10 and the second display substrate 20 may be coupled to teach other.

Figure 11:
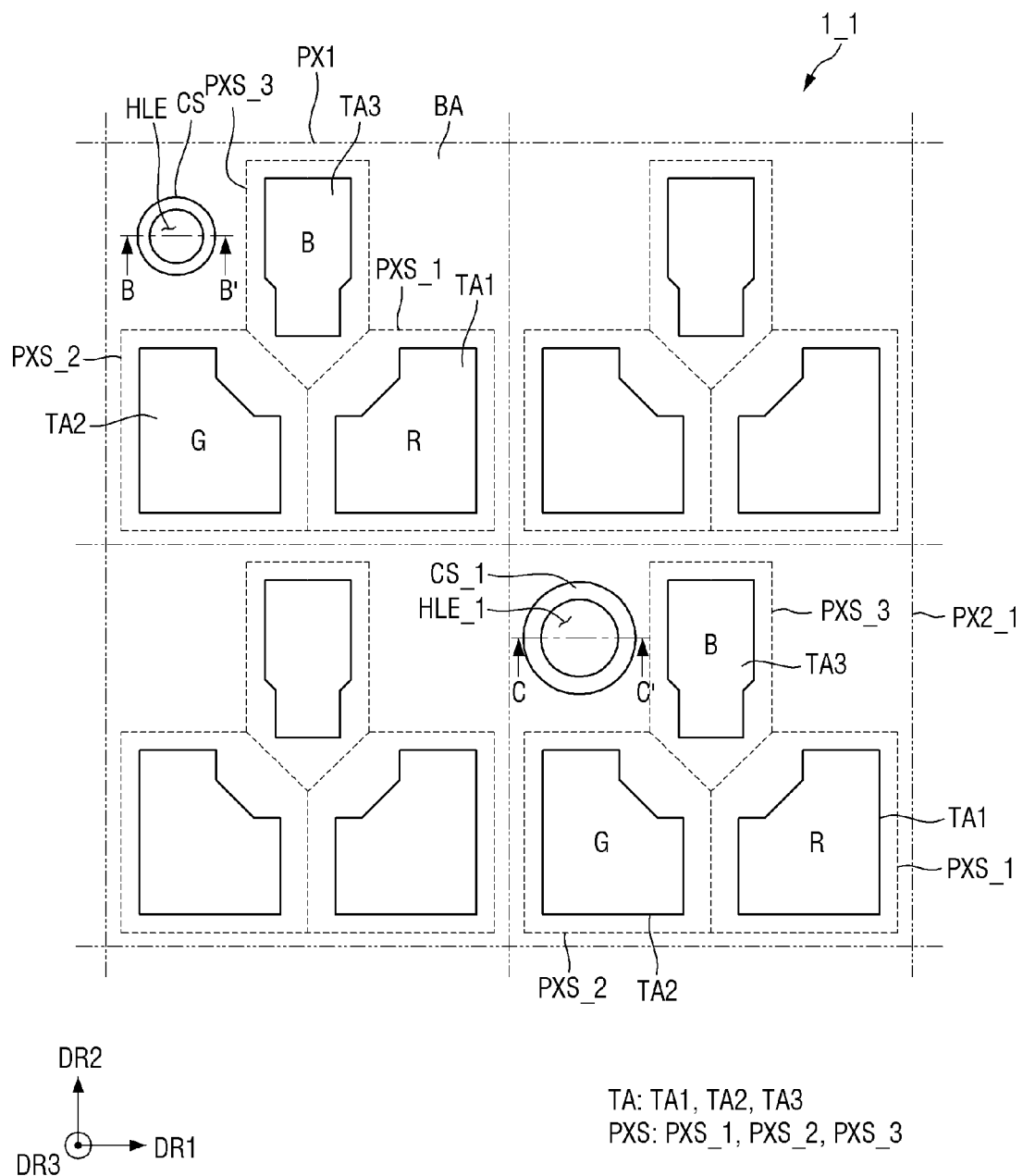
FIG. 11 is a schematic plan view showing an embodiment of a pixel arrangement of a display device.
Figure 12:
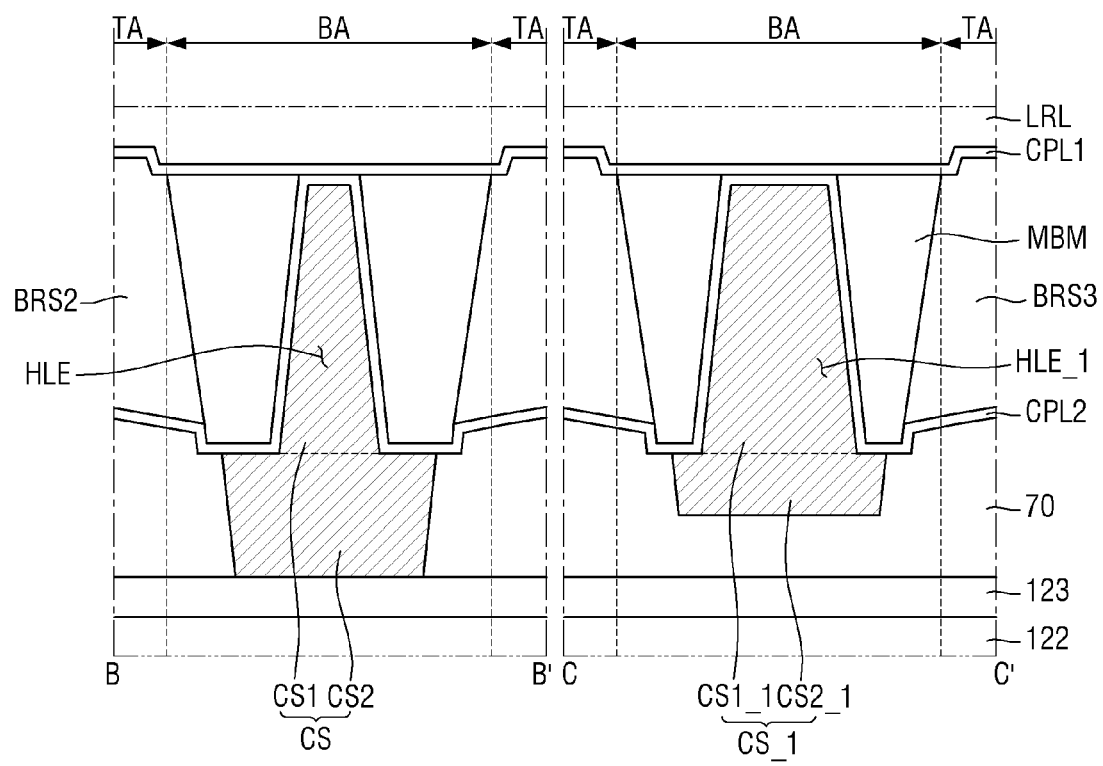
FIG. 12 is an enlarged cross-sectional view taken along lines B-B' and C-C' of FIG. 11.

FIG. 11 is a schematic plan view showing an embodiment of a pixel arrangement of a display device 1_1. FIG. 12 is an enlarged cross-sectional view taken along lines B-B' and C-C' of FIG. 11. A first pixel PX1 of FIG. 11 has the same configuration as the pixel PX (see FIG. 3) according to the above embodiment, but is provided with a separate reference numeral (the first pixel PX1) for simplicity of description. In the following embodiments, a description of the same components as those of the above-described embodiment will be omitted or simplified, and differences will be mainly described.

Referring to FIGS. 11 and 12, a display device 1_1 is different from that of the embodiment of FIG. 3 in that the display device 1_1 includes a sub-spacer CS_1 in addition to the spacer CS.

Specifically, the spacer CS may be provided in the first pixel PX1, and a sub-through hole HLE_1 and the sub-spacer CS_1 may be further provided in a second pixel PX2_1 different from the first pixel PX1.

The sub-through hole HLE_1 may penetrate the bank layer MBM along the thickness direction. A planar dimension of the sub-through hole HLE_1 may be larger than a planar dimension of the through hole HLE of the first pixel PX1. Accordingly, the height (or spacer thickness) of the sub-spacer CS_1 of the second pixel PX2_1 may be smaller than the height (or spacer thickness) of the spacer CS of the first pixel PX1. A planar dimension may be taken parallel to a plane which is defined by the first direction DR1 and the second direction DR2 which cross each other.

At least a portion of the sub-spacer CS_1 may be disposed in the sub-through hole HLE_1. The sub-spacer CS_1 may include a second filling portion CS1_1 disposed in the sub-through hole HLE_1 and a second protrusion CS2_1 protruding outside of the bank layer MBM. The second protrusion CS2_1 of the sub-spacer CS_1 may not directly contact the second inorganic film 123 of the first display substrate 10 disposed thereunder. That is, the second protrusion CS2_1 of the sub-spacer CS_1 may be spaced apart along the thickness direction from the second inorganic film 123 of the first display substrate 10 disposed thereunder.

The sub-spacer CS_1 may serve to maintain a cell gap (or distance) between the first display substrate 10 and the second display substrate 20, in conjunction with the spacer CS. As the second display substrate 20 (see FIG. 4) is pressed, the first display substrate 10 or the second display substrate 20 may be partially pushed downward (e.g., toward the other substrate). By the pressing of a respective display substrate, the sub-spacer CS_1 comes into contact with the second inorganic film 123 of the first display substrate 10 disposed thereunder, thereby serving to support the first display substrate 10 or the second display substrate 20 such that the cell gap between the first display substrate 10 and the second display substrate 20 is no longer reduced.

The sub-spacer CS_1 may be provided or formed together during a process of forming the spacer CS. The planar dimension of the sub-through hole HLE_1 in which the sub-spacer CS_1 is disposed is larger than the planar dimension of the through hole HLE. Thus, when a material for provided or forming the spacer CS and the sub-spacer CS_1 is applied to a stacked structure (referring to FIGS. 9 and 10), the height (or spacer thickness) of the material may be smaller in a region where the sub-through hole HLE_1 is disposed than in a region where the through hole HLE is disposed.

However, a method for forming the spacer CS and the sub-spacer CS_1 having different heights (or spacer thicknesses) is not limited thereto, and the spacer CS and the sub-spacer CS_1 may be provided or formed using a half-tone mask or a multi-tone mask.

In the display device 1_1 including the sub-spacer CS_1 and the spacer CS, the height (or total thickness TH) of the color control layer may be more accurately measured by using a reference surface exposed to outside the bank layer MBM at the through hole HLE and/or the sub-through hole HLE_1. Thus, defects due to the variation in height (or total thickness TH) of the color control layer may be suppressed or prevented. By providing the sub-through hole HLE_1 having a larger planar dimension than the through hole HLE, the sub-spacer CS_1 may be provided or formed during the process of forming the spacer CS, so that an additional process is unnecessary.

Figure 13:
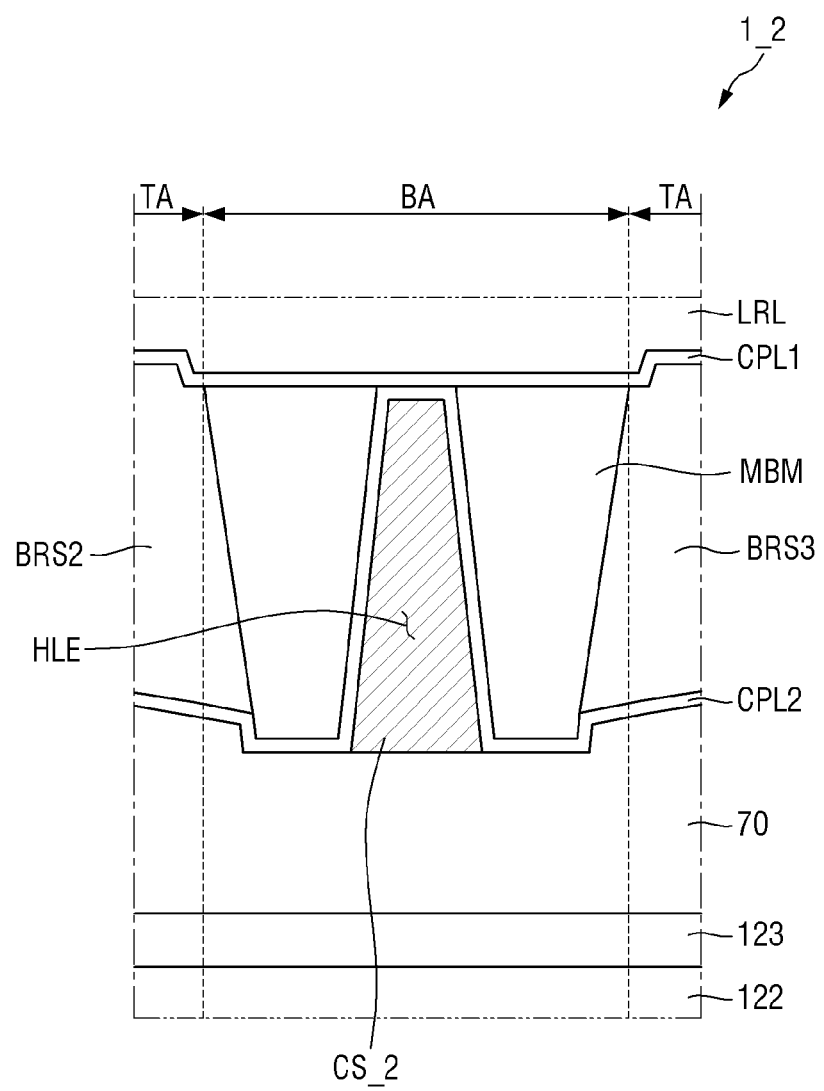
FIG. 13 is an enlarged cross-sectional view of an embodiment of a display device.

FIG. 13 is an enlarged cross-sectional view of an embodiment of a display device 1_2.

Referring to FIG. 13, a display device 1_2 is different from that of the embodiment of FIG. 5 in that a spacer CS_2 does not protrude outside of the through hole HLE to below the second capping layer CPL2.

Specifically, one surface (the bottom surface which is furthest from the second substrate 210) of the spacer CS_2 may be at the same height as one surface (the bottom surface which is furthest from the second substrate 210) of the second capping layer CPL2. That is, the bottom surface of the spacer CS_2 may be coplanar with the bottom surface of the second capping layer CPL2.

The spacer CS_2 fills the entire inner region of the through hole HLE, but may not protrude outside of the through hole HLE and the second capping layer CPL2. The spacer CS_2 may be spaced apart along the thickness direction from the second inorganic film 123 disposed thereunder and may not directly contact the second inorganic film 123. The filling layer 70 may be disposed under the spacer CS_2.

Even in the embodiment where the spacer CS_2 does not protrude outside of the through hole HLE to below the second capping layer CPL2, the height (or total thickness TH) of the color control layer may be more accurately measured by using a surface of the first capping layer CPL1 which is exposed at the through hole HLE, and defects due to the variation in height (or total thickness TH) of the color control layer may be suppressed or prevented.

Figure 14:
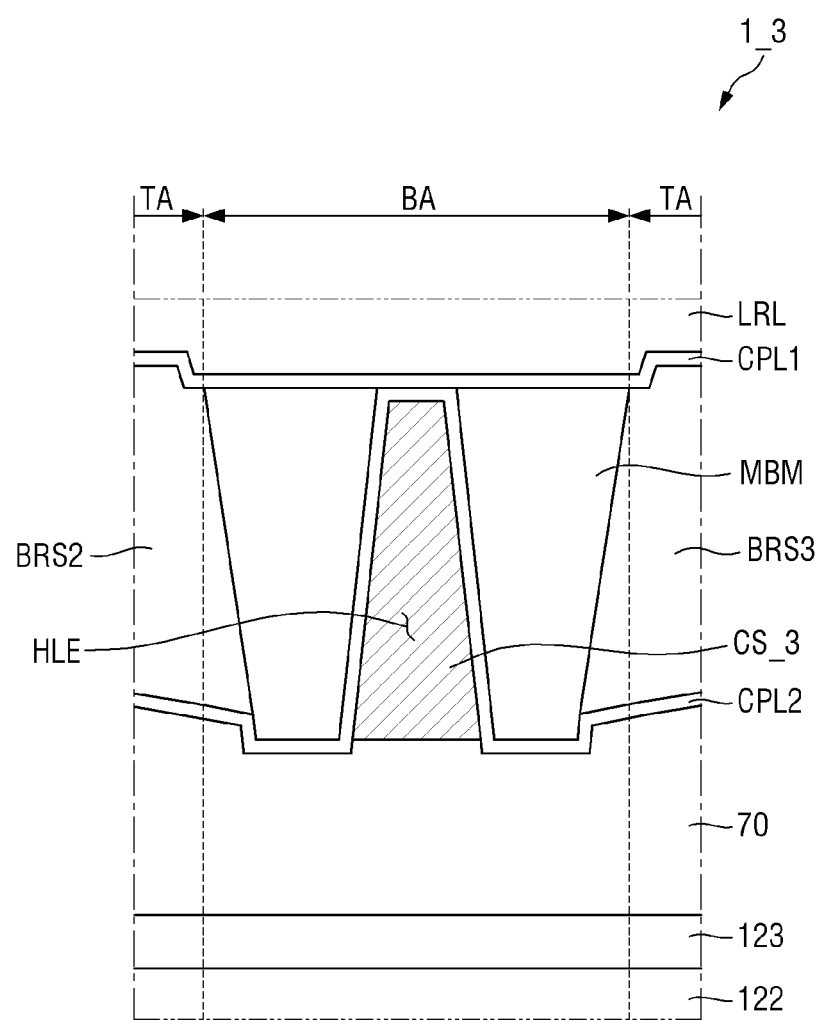
FIG. 14 is an enlarged cross-sectional view of an embodiment of a display device.

FIG. 14 is an enlarged cross-sectional view of an embodiment of a display device 1_3.

Referring to FIG. 14, a display device 1_3 is different from that of the embodiment of FIG. 13 in that one surface (the bottom surface which is furthest from the second substrate 210) of a spacer CS_3 is at the same height as one surface (the bottom surface which is furthest from the second substrate 210) of the bank layer MBM.

Specifically, the spacer CS_3 may fill the inside of the through hole HLE. One surface (the bottom surface which is furthest from the second substrate 210) of the spacer CS_3 may be at the same height as one surface (the bottom surface which is furthest from the second substrate 210) of the bank layer MBM. That is, the bottom surface of the spacer CS_3 may be coplanar with the bottom surface of the bank layer MBM. The bottom surface of the spacer CS_3 is at a different height from the bottom surface of the second capping layer CPL2. The bottom surface of the spacer CS_3 may be positioned above one surface (the bottom surface which is furthest from the second substrate 210) of the second capping layer CPL2.

Even in the embodiment where the spacer CS_3 is at a different height from the bottom surface of the second capping layer CPL2, the height (or total thickness TH) of the color control layer may be more accurately measured by using a surface of the first capping layer CPL1 which is exposed at through the through hole HLE, and defects due to the variation in height (or total thickness TH) of the color control layer may be suppressed or prevented.

Figure 15:
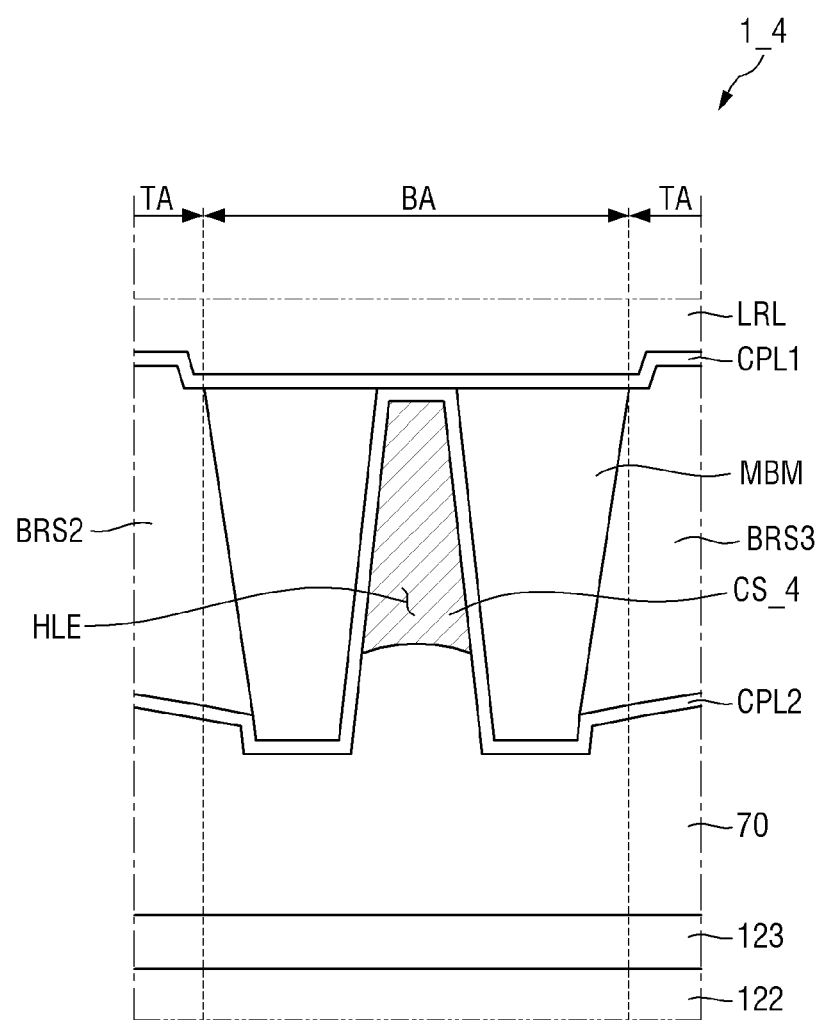
FIG. 15 is an enlarged cross-sectional view of an embodiment of a display device.

FIG. 15 is an enlarged cross-sectional view of a display device 1_4.

Referring to FIG. 15, a display device 1_4 is different from that of the embodiment of FIG. 5 in that a spacer CS_4 partially fills the inner region of the through hole HLE.

Specifically, the spacer CS_4 is disposed in the through hole HLE to fill the inside of the through hole HLE, but may only fill a portion of the inner region of the through hole HLE. The inner region of the through hole HLE is partially filled with the spacer CS_4, and the remaining region that is not filled with the spacer CS_4 may be filled by the filling layer 70. That is, the inside of the through hole HLE may be filled with portions of the spacer CS_4 and the filling layer 70.

One surface (the bottom surface which is furthest from the second substrate 210) of the spacer CS_4 may be located above both one surface (the bottom surface which is furthest from the second substrate 210) of the bank layer MBM and one surface (the bottom surface which is furthest from the second substrate 210) of the second capping layer CPL2. That is, the bottom surface of the spacer CS_4 is closer to the second substrate 210 than the bottom surface of the bank layer MBM and the bottom surface of the second capping layer CPL2.

Even in the embodiment where the spacer CS_4 partially fills the inner region of the through hole HLE, the height (or total thickness TH) of the color control layer may be more accurately measured by using a surface of the first capping layer CPL1 which is exposed at the through hole HLE, and defects due to the variation in height (or total thickness TH) of the color control layer may be suppressed or prevented.

Figure 16:
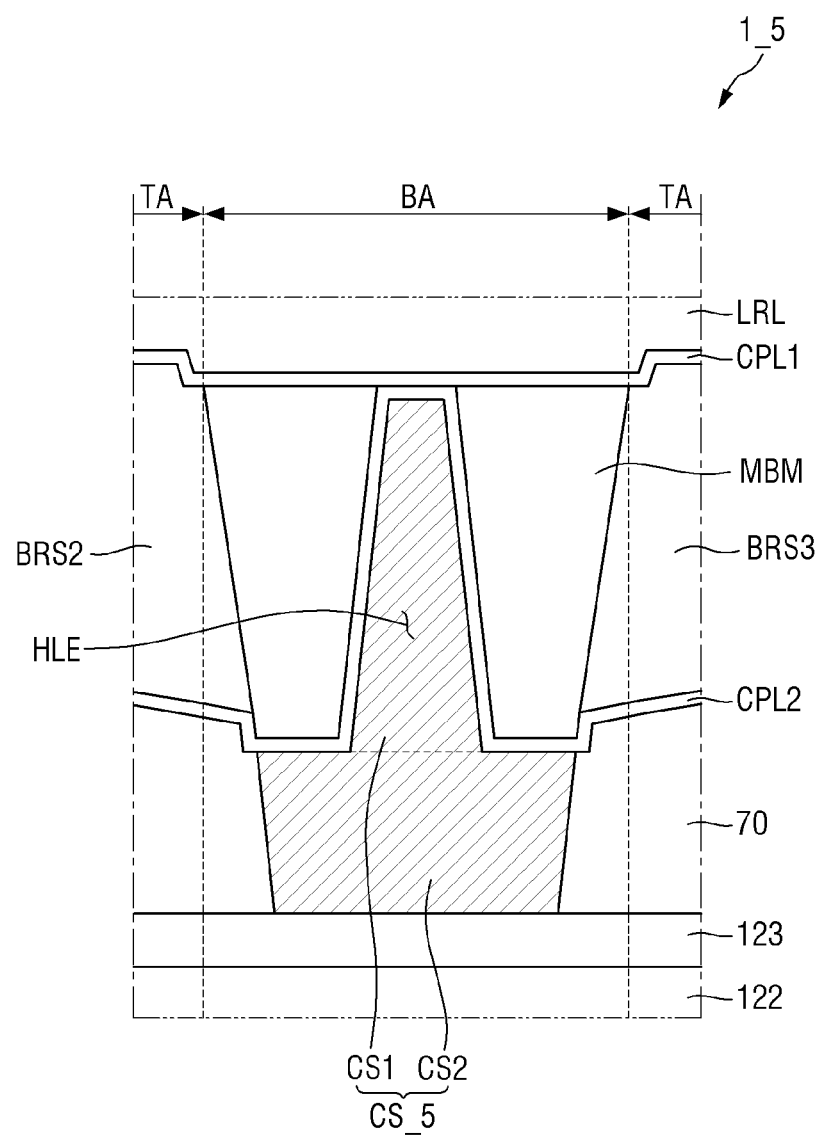
FIG. 16 is an enlarged cross-sectional view of an embodiment of a display device.

FIG. 16 is an enlarged cross-sectional view of a display device 1_5.

Referring to FIG. 16, a display device 1_5 is different from that of the embodiment of FIG. 5 in that the side surface of a spacer CS_5 is aligned with a portion of the side surface of the bank layer MBM. That is, the side surface of a spacer CS_5 may be coplanar with the side surface of the bank layer MBM.

The bank layer MBM may include an outer side surface at a respective opening among the openings OP1, OP2, and OP3 and an inner side surface at the through hole HLE.

Specifically, the spacer CS_5 may include the first filling portion CS1 and the first protrusion CS2, and the side surface of the first protrusion CS2 may be aligned with a portion of the outer side surface of the bank layer MBM.

Even in the embodiment where the side surface of a spacer CS_5 is aligned with a portion of the side surface of the bank layer MBM, the height (or total thickness TH) of the color control layer may be more accurately measured by using a surface of the first capping layer CPL1 which is exposed at the through hole HLE, and defects due to the variation in height (or total thickness TH) of the color control layer may be suppressed or prevented.

The spacers CS_2, CS_3, CS_4 and CS_5 of FIGS. 13 to 16 described above may be disposed alone in the pixels PX, but are not limited thereto. As in the embodiments of FIGS. 11 and 12, the spacers CS_2, CS_3, CS_4 and CS_5 may be disposed together with the spacer CS of the embodiment of FIG. 5.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
    a substrate comprising a light transmission region at which light is emitted from the display device, and a light blocking region which is adjacent to the light transmission region;
    a first color filter pattern which is on the substrate and selectively transmits light of a first color;
    a bank layer facing the substrate with the first color filter pattern therebetween;
    an intermediate layer between the bank layer and the first color filter pattern;
    in the light transmission region:
        a first opening defined in the bank layer; and
        a wavelength control pattern in the first opening of the bank layer; and
    in the light blocking region:
        a second opening defined in the bank layer and spaced apart from the first opening, the second opening exposing the intermediate layer to outside the bank layer; and
        a filling structure in the second opening of the bank layer,
    wherein each of the first opening and the second opening corresponds to the first color filter pattern.

2. The display device of claim 1, wherein
    the wavelength control pattern includes a wavelength conversion material or a light scatterer, and
    the filling structure excludes both the wavelength conversion material and the light scatterer.

3. The display device of claim 1, wherein the filling structure includes a filling portion which is in the second opening of the bank layer and extends outside of the second opening to define a protrusion of the filling structure which is outside of the bank layer.

4. The display device of claim 3, wherein
    each of the protrusion of the filling structure and the second opening has a dimension along the substrate, and
    the dimension of the protrusion is larger than the dimension of the second opening.

5. The display device of claim 4, wherein the filling structure is spaced apart from the wavelength control pattern along the substrate.

6. The display device of claim 1, further comprising:
    the intermediate layer comprising a first capping layer in both of the light transmission region and the light blocking region, the first capping layer between the first color filter pattern and the bank layer and between the first color filter pattern and the wavelength control pattern; and
    a second capping layer in both of the light transmission region and the light blocking region, the second capping layer facing the first capping layer with both the bank layer and the wavelength control pattern therebetween,
    wherein at a location corresponding to the second opening, the first capping layer and the second capping layer directly contact each other.

7. The display device of claim 6, wherein
    the bank layer comprises an inner wall which defines the second opening,
    the second capping layer extends into the second opening to cover the inner wall of the bank layer, and
    within the second opening, the second capping layer is between the filling structure and the inner wall of the bank layer.

8. The display device of claim 1, further comprising:
a low refractive film in both of the light transmission region and the light blocking region, the low refractive film between the first color filter pattern and the bank layer and between the first color filter pattern and the wavelength control pattern,
wherein
each of the low refractive film and the wavelength control pattern has a refractive index, and
the refractive index of the low refractive film is smaller than the refractive index of the wavelength control pattern.

9. A display device comprising:
a substrate comprising a light transmission region at which light is emitted from the display device, and a light blocking region which is adjacent to the light transmission region;
a first color filter pattern which is on the substrate and selectively transmits light of a first color;
a second color filter pattern which is on the substrate and selectively transmits light of a second color different from the first color;
a third color filter pattern which is on the substrate and selectively transmits light of a third color different from the first color and the second color,
a bank layer facing the substrate with the first color filter pattern therebetween;
in the light transmission region:
  a first opening defined in the bank layer; and
  a wavelength control pattern in the first opening of the bank layer; and
in the light blocking region:
  a second opening defined in the bank layer and spaced apart from the first opening; and
  a filling structure in the second opening of the bank layer,
wherein
each of the first opening and the second opening corresponds to the first color filter pattern, and
at a same location within the light blocking region, the first color filter pattern, the second color filter pattern and the third color filter pattern overlap each other.

10. The display device of claim 9, wherein the second opening further corresponds to each of the second color filter pattern and the third color filter pattern.

11. The display device of claim 10, wherein
the first color is blue, the second color is red, and the third color is green, and
at the same location within the light blocking region, the first color filter pattern, the second color filter pattern and the third color filter pattern are in order in a direction away from the substrate.

12. A display device comprising:
a substrate comprising a light transmission region at which light is emitted from the display device, and a light blocking region which is adjacent to the light transmission region;
a first color filter pattern which is on the substrate and selectively transmits light of a first color;
a bank layer facing the substrate with the first color filter pattern therebetween;
in the light transmission region:
  a first opening defined in the bank layer; and
  a wavelength control pattern in the first opening of the bank layer;
in the light blocking region:
  a second opening defined in the bank layer and spaced apart from the first opening; and
  a filling structure in the second opening of the bank layer; and
a low refractive film in both of the light transmission region and the light blocking region, the low refractive film between the first color filter pattern and the bank layer and between the first color filter pattern and the wavelength control pattern,
wherein
each of the first opening and the second opening corresponds to the first color filter pattern,
each of the low refractive film and the wavelength control pattern has a refractive index,
the refractive index of the low refractive film is smaller than the refractive index of the wavelength control pattern, and
the low refractive film includes an organic material.

13. A display device comprising:
a first display substrate; and
a second display substrate facing the first display substrate,
wherein
the first display substrate includes:
  a first substrate;
  a first electrode on the first substrate;
  a pixel defining layer on the first electrode;
  an opening defined in the pixel defining layer which exposes the first electrode to outside the pixel defining layer;
  a light emitting layer in the opening of the pixel defining layer and on the first electrode which is exposed to outside the pixel defining layer, and
  a second electrode facing the first electrode with the light emitting layer therebetween, and
the second display substrate includes:
  in order in a direction toward the first display substrate,
    a second substrate;
    a color filter layer;
    an intermediate layer; and
    a bank layer defining both an opening, and a through hole which is spaced apart from the opening;
  a wavelength conversion pattern in the opening of the bank layer; and
  a spacer in the through hole of the bank layer.

14. The display device of claim 13, further comprising:
a light transmission region at which light is emitted from the display device, and
a light blocking region which is adjacent to the light transmission region,
wherein
the wavelength conversion pattern and the opening of the bank layer correspond to the light transmission region, and
the spacer and the through hole correspond to the light blocking region.

15. The display device of claim 14, wherein
the wavelength conversion pattern includes a wavelength conversion material or a light scatterer, and
the spacer excludes both the wavelength conversion material and the light scatterer.

16. The display device of claim 13, wherein
the first display substrate further includes a thin film encapsulation layer between the second electrode and the second display substrate, and the spacer of the second display substrate directly contacts the thin film encapsulation layer of the first display substrate.

17. The display device of claim 13, further comprising:
the intermediate layer comprising a first capping layer between the color filter layer and the bank layer and between the color filter layer and the wavelength conversion pattern; and
a second capping layer facing the first capping layer with both the bank layer and the wavelength conversion pattern therebetween,
wherein at a location corresponding to the through hole, the first capping layer and the second capping layer directly contact each other.

18. A method of providing a display device, comprising:
providing a substrate comprising a light transmission region at which light is emitted from the display device, and a light blocking region which is adjacent to the light transmission region;
providing a color filter layer on the substrate;
providing a bank layer facing the substrate with the color filter layer therebetween;
providing in the light transmission region:
   a first opening defined in the bank layer; and
   a color control layer in the first opening, through an inkjet printing process, the color control layer having a thickness; and
providing in the light blocking region:
   a layer between the bank layer and the color filter layer, and
   a second opening which is defined in the bank layer and spaced apart from the first opening, the second opening having a depth and exposing a portion of the layer between the bank layer and the color filter layer to outside the bank layer,
wherein
the providing of the color control layer in the first opening comprises:
   measuring the depth of the second opening with reference to the portion of the layer which is exposed to outside the bank layer, to define a measured depth, and
   providing the thickness based on the measured depth of the second opening, and each of the first opening and the second opening corresponds to the color filter layer.

19. The method of claim 18, further comprising providing a spacer in the second opening of the bank layer,
wherein
the color control layer includes a wavelength conversion material or a light scatterer, and
the spacer excludes both the wavelength conversion material and the light scatterer.

20. A method of providing a display device, comprising:
providing a substrate comprising a light transmission region at which light is emitted from the display device, and a light blocking region which is adjacent to the light transmission region;
providing a color filter layer on the substrate;
providing a bank layer facing the substrate with the color filter layer therebetween;
providing in the light transmission region:
   a first opening defined in the bank layer; and
   a color control layer in the first opening, through an inkjet printing process, the color control layer having a thickness;
providing in the light blocking region, a second opening defined in the bank layer and spaced apart from the first opening, the second opening having a depth; and
after the providing of the color filter layer, providing a low refractive film in both of the light transmission region and the light blocking region,
wherein
the providing of the color control layer in the first opening comprises providing the thickness based on the depth of the second opening,
each of the first opening and the second opening corresponds to the color filter layer,
the low refractive film is between the color filter layer and the bank layer and between the color filter layer and the color control layer, and
the low refractive film includes an organic material.

\* \* \* \* \*